(12) United States Patent
Setta

(10) Patent No.: US 8,043,948 B2
(45) Date of Patent: Oct. 25, 2011

(54) SEMICONDUCTOR DEVICE MANUFACTURING METHOD AND DESIGN SUPPORT APPARATUS

(75) Inventor: Yuji Setta, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 87 days.

(21) Appl. No.: 12/691,006

(22) Filed: Jan. 21, 2010

(65) Prior Publication Data

US 2010/0190327 A1   Jul. 29, 2010

(30) Foreign Application Priority Data

Jan. 23, 2009   (JP) .................... 2009-013046

(51) Int. Cl.
*H01L 21/3205* (2006.01)

(52) U.S. Cl. .................. 438/585; 438/586; 257/E21.19; 257/E21.206; 716/55

(58) Field of Classification Search .................. 438/585, 438/586, 587; 257/E21.19, E21.206; 216/46; 716/50, 55
See application file for complete search history.

(56) References Cited

U.S. PATENT DOCUMENTS

| | | | |
|---|---|---|---|
| 4,037,307 A * | 7/1977 | Smith | 438/301 |
| 6,362,057 B1* | 3/2002 | Taylor et al. | 438/286 |
| 7,508,065 B2* | 3/2009 | Sherrer et al. | 257/704 |
| 7,669,172 B2* | 2/2010 | Ito et al. | 716/54 |
| 7,770,145 B2* | 8/2010 | Nakano et al. | 716/53 |
| 7,772,070 B2* | 8/2010 | Kitajima et al. | 438/275 |
| 7,794,614 B2* | 9/2010 | Weis et al. | 216/41 |
| 2006/0199325 A1* | 9/2006 | Maeno et al. | 438/199 |
| 2007/0238053 A1* | 10/2007 | Hashimoto | 430/313 |

FOREIGN PATENT DOCUMENTS

JP   2007-150166 A   6/2007

* cited by examiner

*Primary Examiner* — Lex Malsawma
(74) *Attorney, Agent, or Firm* — Westerman, Hattori, Daniels & Adrian, LLP

(57) ABSTRACT

A semiconductor device manufacturing method includes: forming a conductive film over a substrate; forming an assist pattern on the conductive film; forming a metal film to cover the conductive film and the assist pattern; etching back the metal film to form at least one side wall film on a side surface of the assist pattern; removing the assist pattern; forming at least one resist pattern to selectively expose a portion of the conductive film and a portion of the side wall film; performing etching using the resist pattern as a mask to remove the exposed portion of the side wall film; and etching the conductive film using the side wall film as a mask to form a gate electrode and a contact region electrically connected to the gate electrode.

4 Claims, 45 Drawing Sheets

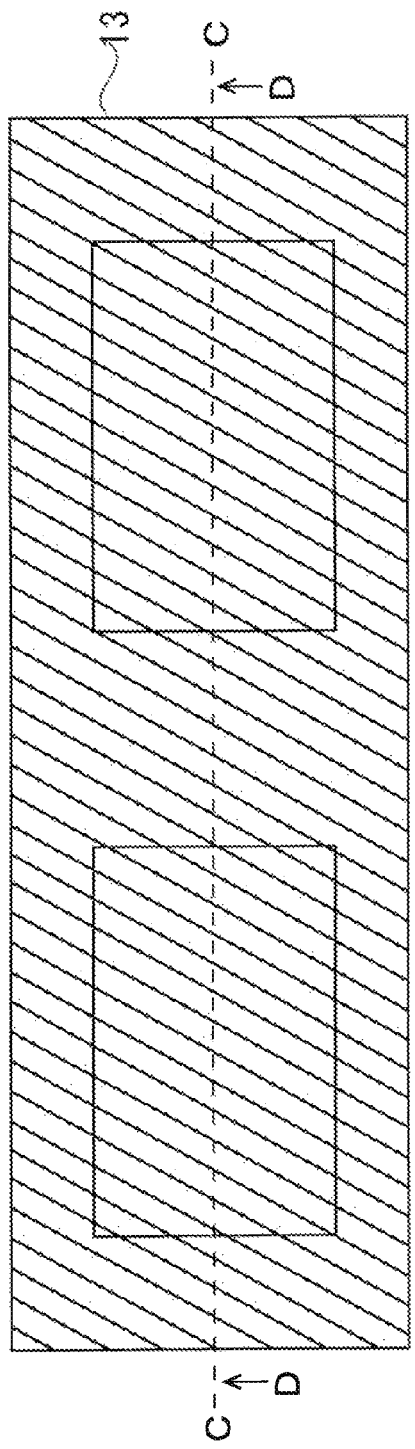
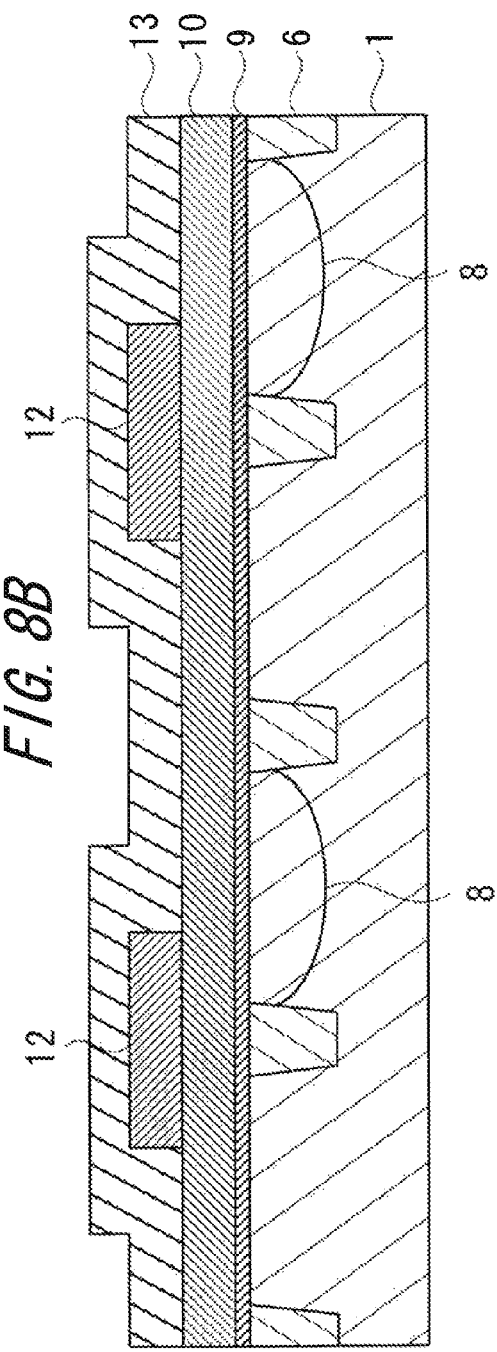
FIG. 8A
FIG. 8B

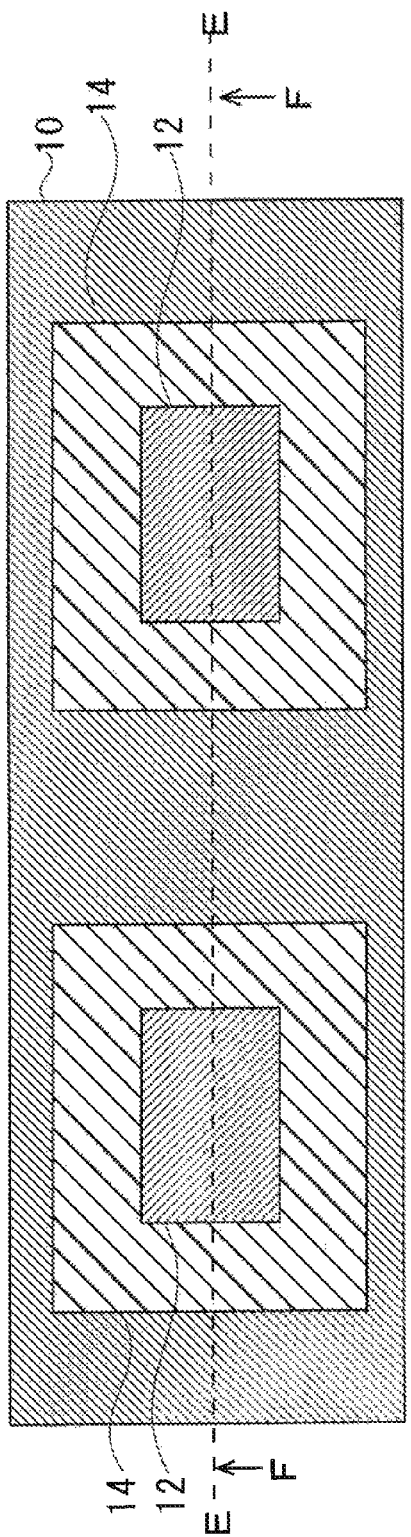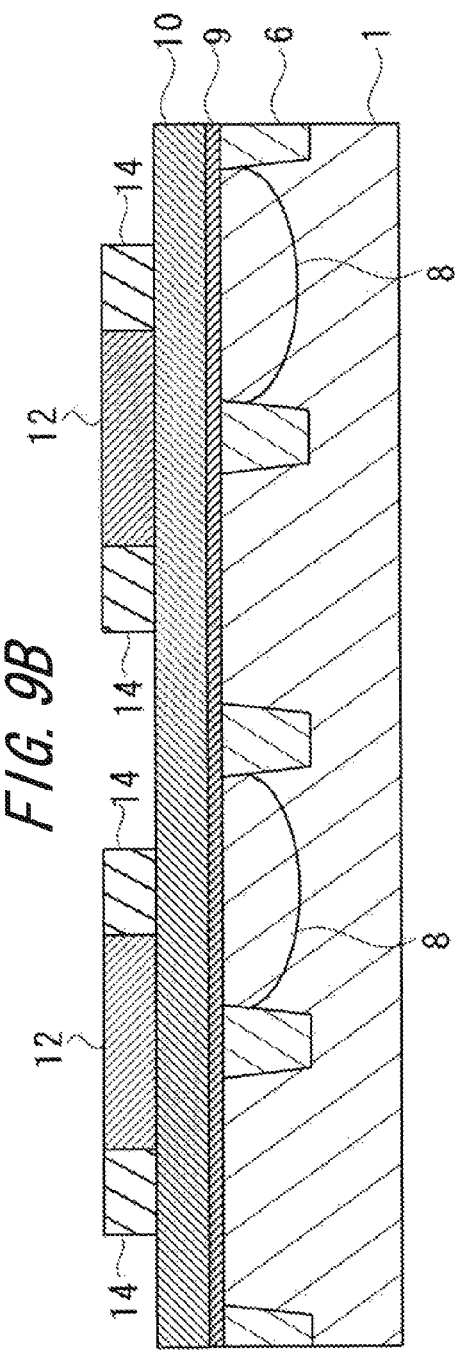

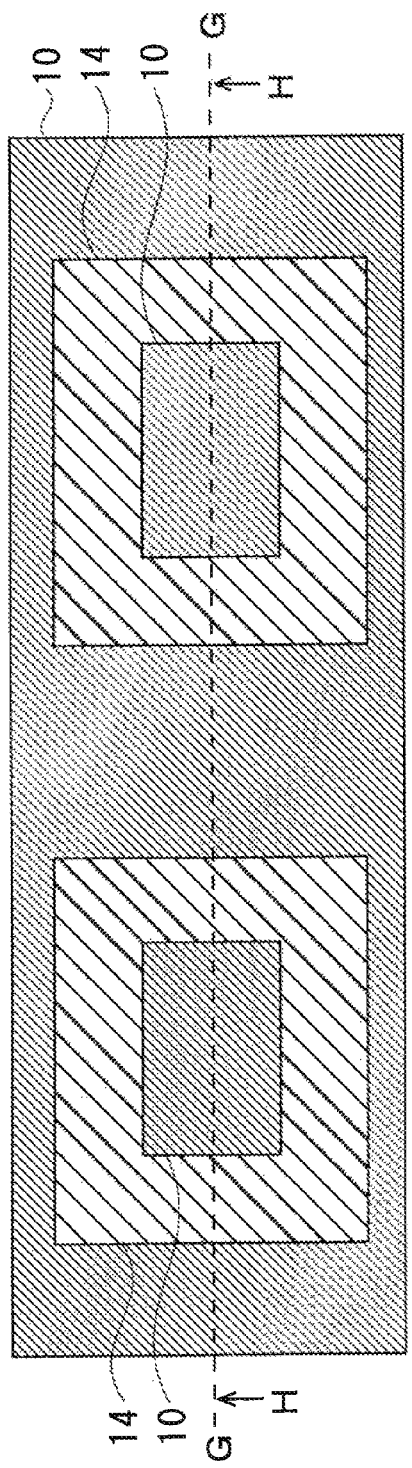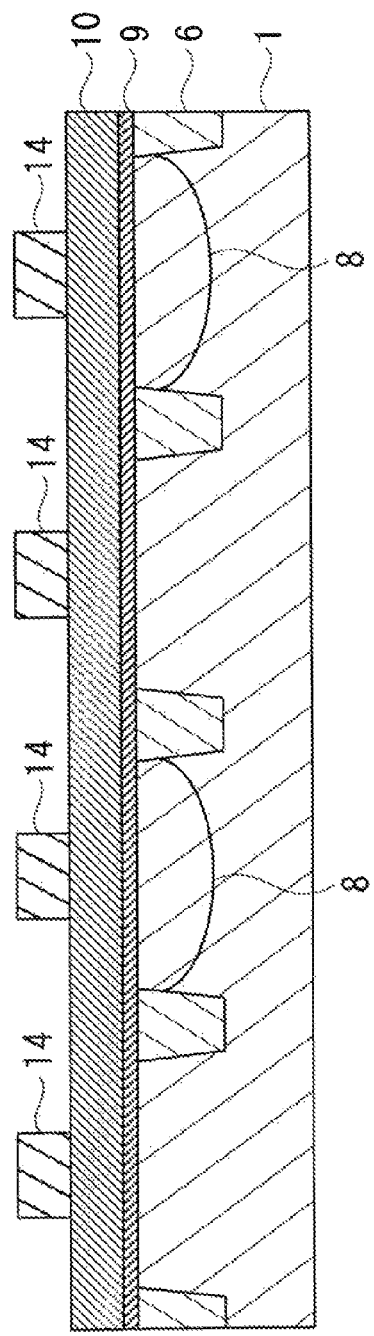

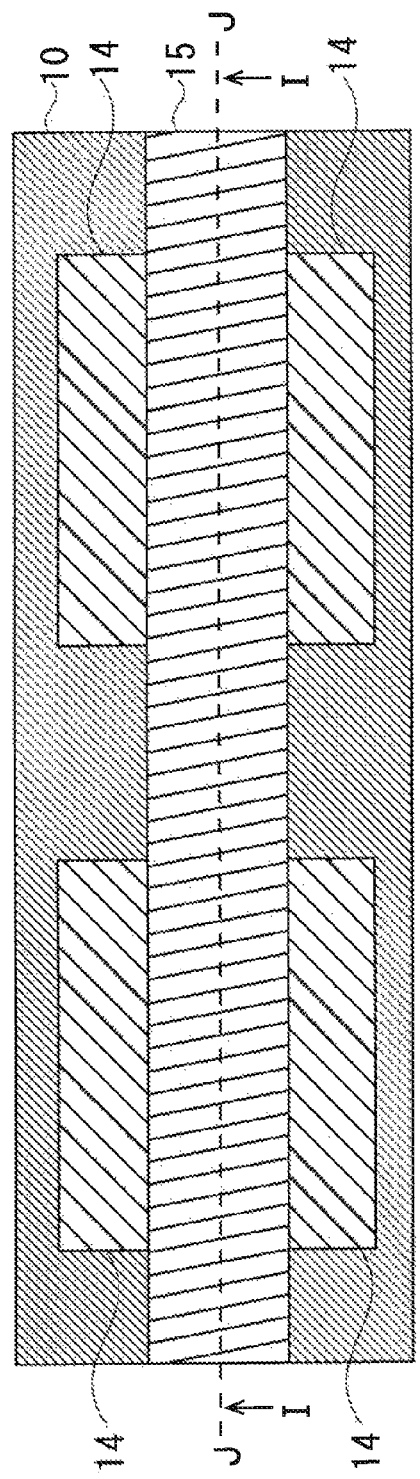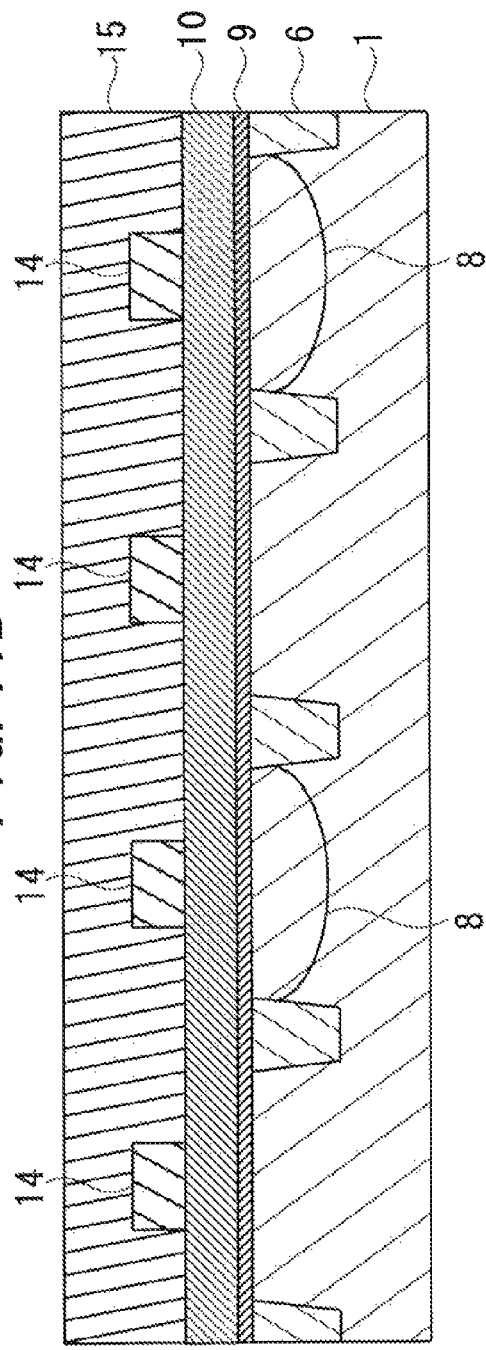
FIG. 11A
FIG. 11B

FIG. 43
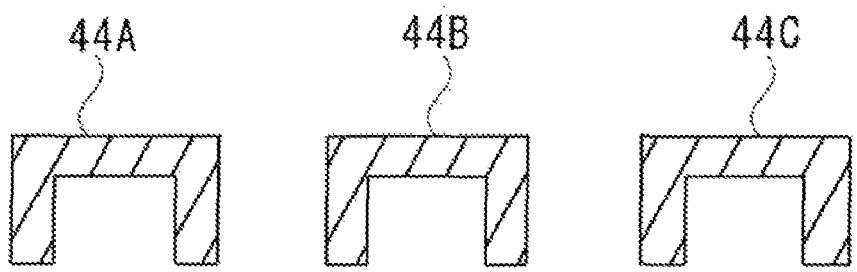
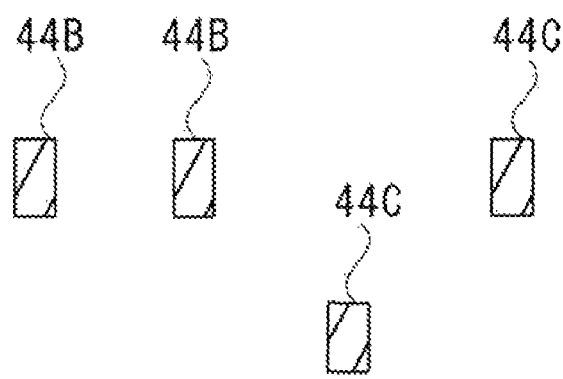
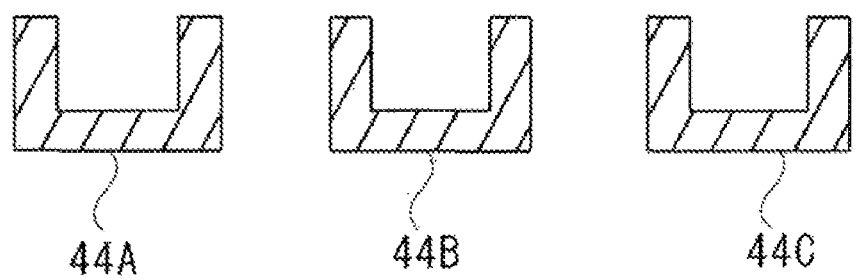

SEMICONDUCTOR DEVICE MANUFACTURING METHOD AND DESIGN SUPPORT APPARATUS

CROSS-REFERENCE TO RELATED APPLICATIONS

This application is based upon and claims the benefit of prior Japanese Patent Application No. 2009-013046 filed on Jan. 23, 2009, the entire contents of which are incorporated herein by reference.

FIELD

The embodiments relate to a semiconductor device manufacturing method and a design support apparatus.

BACKGROUND

A reduction in size of semiconductor devices has been demanded. In recent years, a fine pitch pattern which cannot be achieved by a wavelength of an exposure light source used for a semiconductor device manufacturing process has been demanded. With such a state, in order to form a fine pattern, a manufacturing process having a desired design is constructed using a method such as double patterning.

In double patterning using multiple exposure, it is necessary to strictly control an overlapping exposure of second patterning on first patterning. Therefore, when a desired large scale integration (LSI) circuit pattern cannot be suitably divided, a double patterning method called a spacer method is used.

Japanese Laid-open Patent Publication No. 2007-150166

SUMMARY

The spacer method has an advantage that control for positional deviation is not strict, but there is a limit that the number of shape patterns which may be formed is small. Therefore, there is a case where a contact region (also called pad region) for contact is formed in an additional step. The contact region is a region for efficiently connecting an upper layer electrode to a lower layer electrode.

A semiconductor device manufacturing method according to one aspect of the embodiments includes: forming a conductive film over a substrate; forming an assist pattern on the conductive film; forming a metal film to cover the conductive film and the assist pattern; etching back the metal film to form at least one side wall film which is the metal film on a side surface of the assist pattern; removing the assist pattern after the forming the side wall film; forming at least one resist pattern to selectively expose a portion of the conductive film and a portion of the side wall film, after the removing the assist pattern; performing etching using the resist pattern as a mask to remove the exposed portion of the side wall film; and etching the conductive film using the side wall film as a mask to form a gate electrode and a contact region electrically connected to the gate electrode, in which a shape of the side wall film left on the conductive film by removing a portion exposed from the resist pattern corresponds to a shape of the gate electrode and a shape of the contact region, and a shape of the assist pattern is in contact with at least three sides of the side wall film corresponding to the shape of the contact region.

The object and advantages of the embodiment will be realized and attained by means of the elements and combinations particularly pointed out in the claims. It is to be understood that both the foregoing general description and the following detailed description are exemplary and explanatory and are not restrictive of the embodiment, as claimed.

BRIEF DESCRIPTION OF THE DRAWINGS

FIG. 8A is a top view illustrating the semiconductor device according to the first embodiment.

FIG. 8B is a cross sectional view illustrating the semiconductor device according to the first embodiment.

FIG. 9A is a top view illustrating the semiconductor device according to the first embodiment.

FIG. 9B is a cross sectional view illustrating the semiconductor device according to the first embodiment.

FIG. 10A is a top view illustrating the semiconductor device according to the first embodiment.

FIG. 10B is a cross sectional view illustrating the semiconductor device according to the first embodiment.

FIG. 11A is a top view illustrating the semiconductor device according to the first embodiment.

FIG. 11B is a cross sectional view illustrating the semiconductor device according to the first embodiment.

FIG. 43 illustrates design data.

DESCRIPTION OF EMBODIMENTS

Hereinafter, semiconductor devices, manufacturing methods therefor, and a design support apparatus according to the embodiments are described with reference to the attached drawings. The following structures in the embodiments are examples.

First Embodiment

Figure 1:
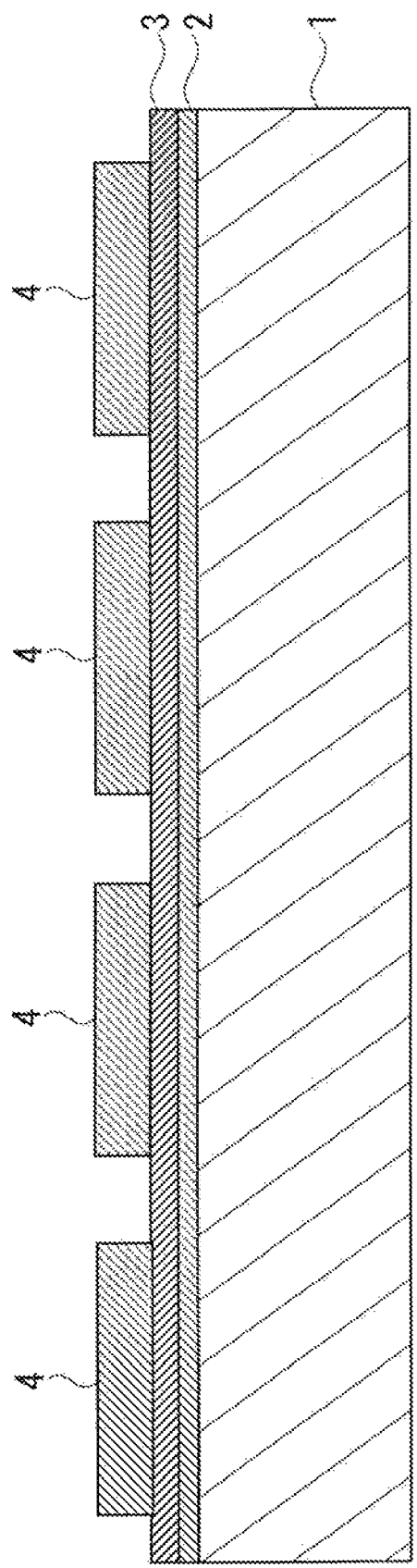
FIG. 1 is a cross sectional view illustrating a semiconductor device according to a first embodiment.

A semiconductor device and a manufacturing method therefor according to a first embodiment are described with reference to FIGS. 1 to 21. In the semiconductor device manufacturing method according to the first embodiment, as illustrated in FIG. 1, a silicon oxide film 2 having a film thickness of 5 nm is formed on the entire surface of a semiconductor substrate 1 by, for example, a thermal oxidation method. For example, a p-type silicon substrate is used as the semiconductor substrate 1. Then, a silicon nitride film 3 having a film thickness of 80 nm is formed on the silicon oxide film 2 by, for example, a chemical vapor deposition (CVD) method. Therefore, a hard mask including the silicon oxide film 2 and the silicon nitride film 3 is formed.

Figure 2:
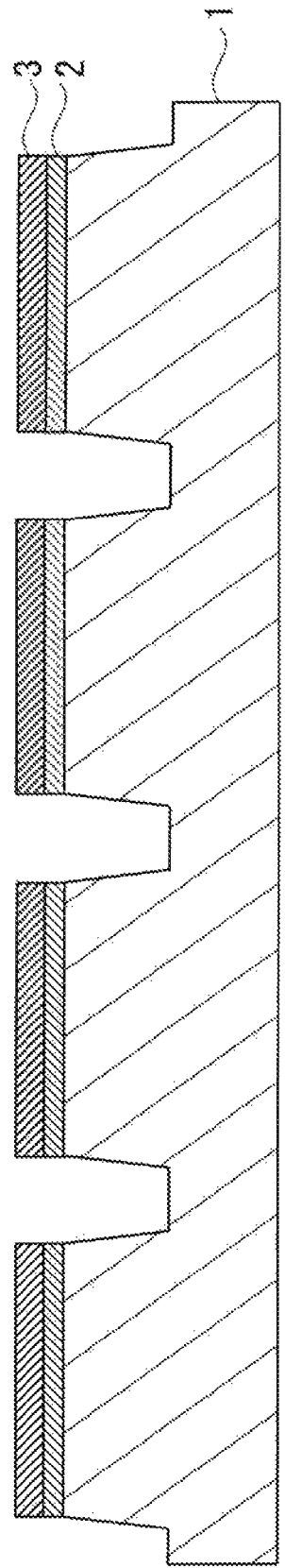
FIG. 2 is a cross sectional view illustrating the semiconductor device according to the first embodiment.

Next, a photo resist film is formed on the silicon nitride film 3 by, for example, a spin coating method. Then, as illustrated in FIG. 1, a resist pattern 4 is formed on the silicon nitride film 3 by a photolithography technology. The silicon oxide film 2 and the silicon nitride film 3 are etched using the resist pattern 4 as a mask. Then, the resist pattern 4 is removed. After that, the semiconductor substrate 1 is etched using the silicon oxide film 2 and the silicon nitride film 3 as the hard mask, to thereby form trenches in the semiconductor substrate 1 as illustrated in FIG. 2.

Figure 3:
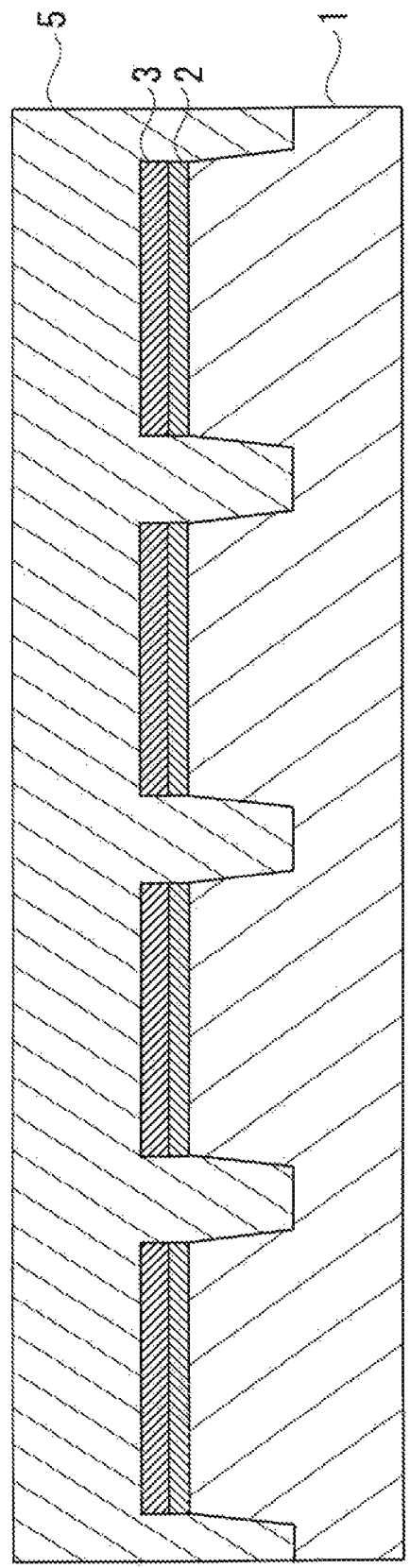
FIG. 3 is a cross sectional view illustrating the semiconductor device according to the first embodiment.
Figure 4:
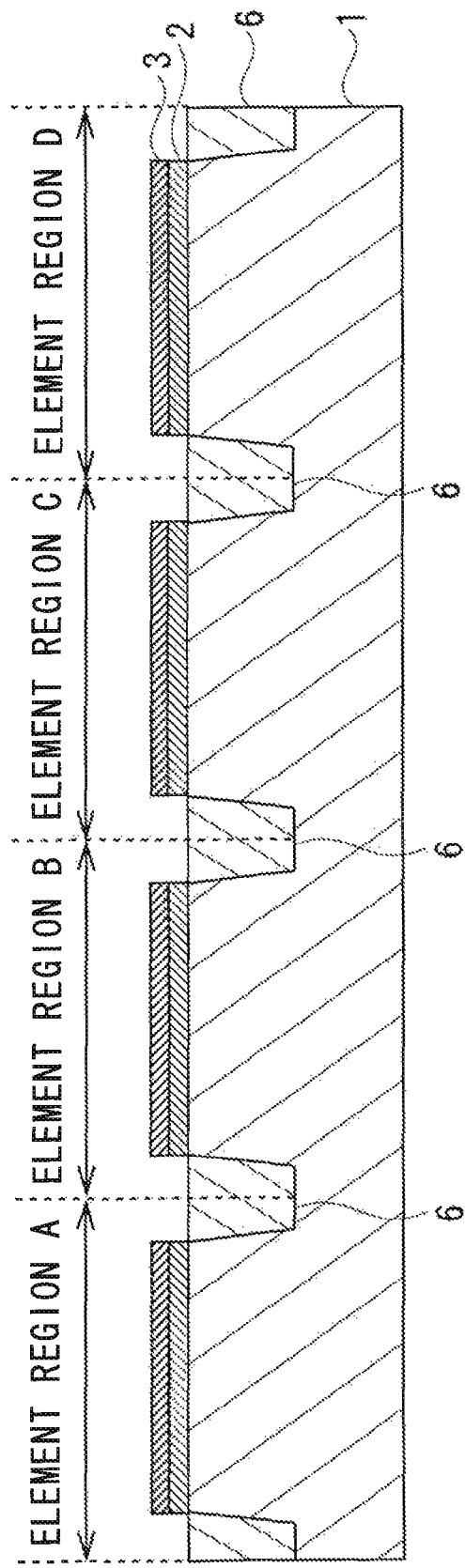
FIG. 4 is a cross sectional view illustrating the semiconductor device according to the first embodiment.

Next, as illustrated in FIG. 3, a silicon oxide film 5 having a film thickness of 450 nm is formed on the entire surface of the semiconductor substrate 1 by, for example, a plasma CVD method. Then, a surface of the silicon oxide film 5 is polished by, for example, a chemical mechanical polishing (CMP) method until a surface of the silicon nitride film 3 is exposed. The silicon nitride film 3 serves as a stopper film during polishing. When the surface of the silicon oxide film 5 is polished, element isolation regions 6 are formed in the trenches of the semiconductor substrate 1 as illustrated in FIG. 4. When the element isolation regions 6 are formed in the semiconductor substrate 1, element regions "A", "B", "C", and "D" are defined in the semiconductor substrate 1.

Figure 5:
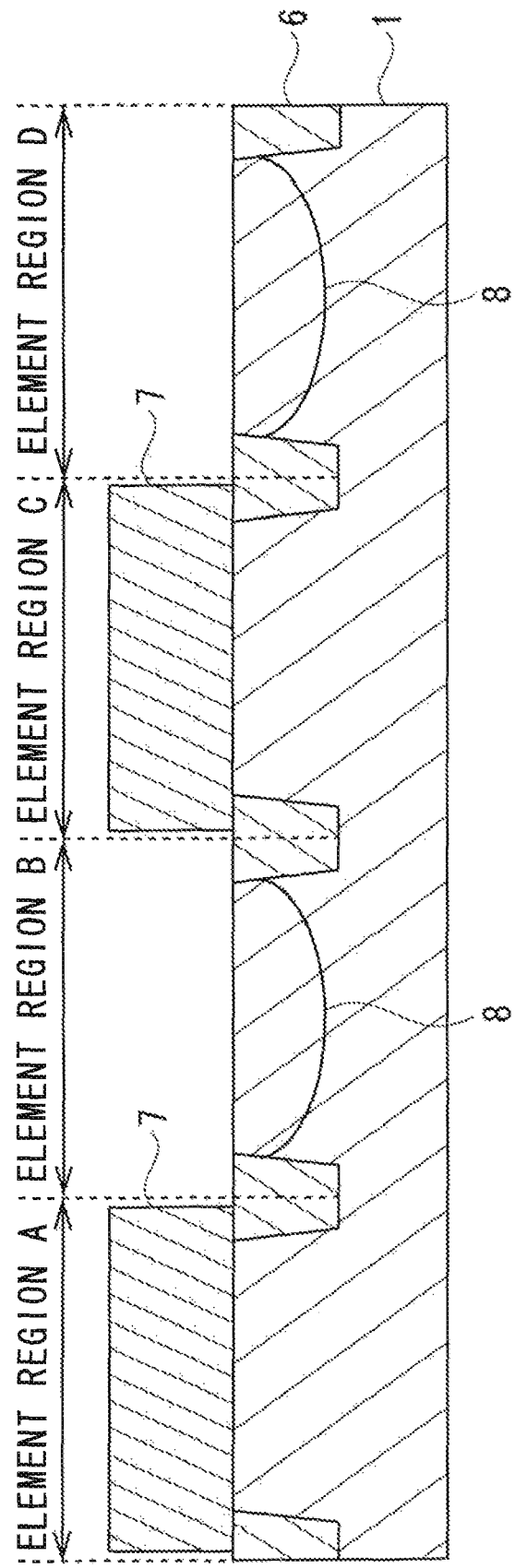
FIG. 5 is a cross sectional view illustrating the semiconductor device according to the first embodiment.

Next, the silicon oxide film 2 and the silicon nitride film 3 which are left above the semiconductor substrate 1 are removed by, for example, wet etching. Then, a photo resist film is formed on the entire surface of the semiconductor substrate 1 by, for example, a spin coating method. The photo resist film is patterned by a photolithography technology to form a resist pattern 7 covering the element regions "A" and "C" as illustrated in FIG. 5. N-type impurities are implanted into the semiconductor substrate 1 using the resist pattern 7 as a mask to form n-type wells 8 in the semiconductor substrate 1. For example, phosphorus (P) is used as the n-type impurity. After that, the resist pattern 7 is removed.

Figure 6:
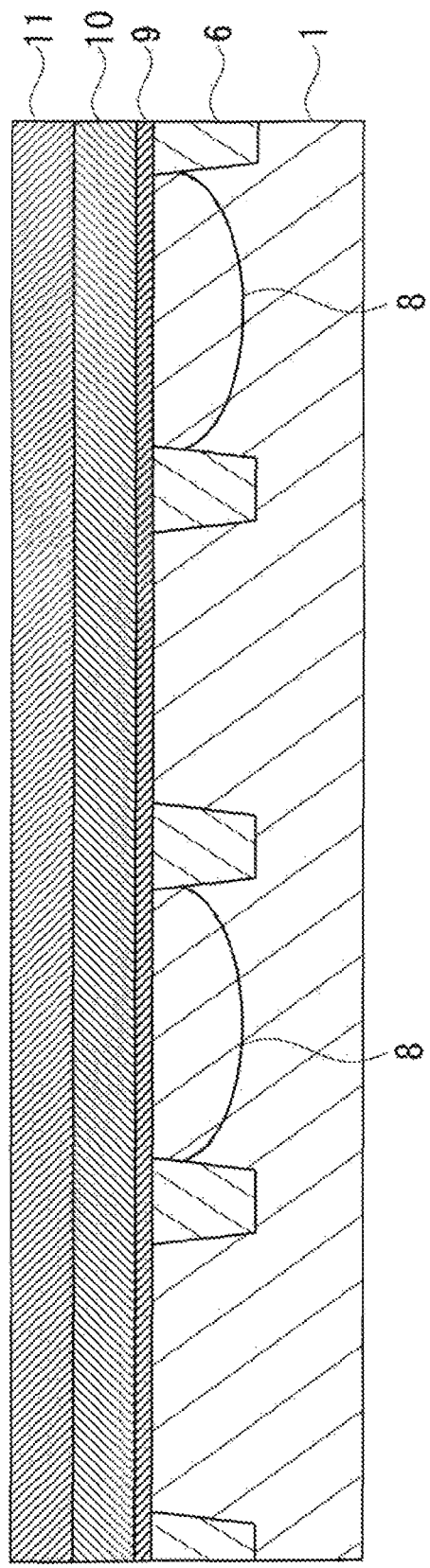
FIG. 6 is a cross sectional view illustrating the semiconductor device according to the first embodiment.

Next, as illustrated in FIG. 6, a gate insulating film 9 having a film thickness of 2 nm is formed by, for example, a thermal oxidation method. A polysilicon film 10 (corresponding to conductive film) having a film thickness of 100 nm is formed on the gate insulating film 9 by, for example, a CVD method. Next, a metal film 11 having a film thickness of 80 nm to 120 nm is formed on the polysilicon film 10 by, for example, a CVD method or a CVD sputtering method. The metal film 11 is, for example, a polysilicon film.

Next, a photo resist film is formed on the metal film 11 by, for example, a spin coating method. The photo resist film is patterned by a photolithography technology to form a resist pattern on the metal film 11.

Figure 7A:
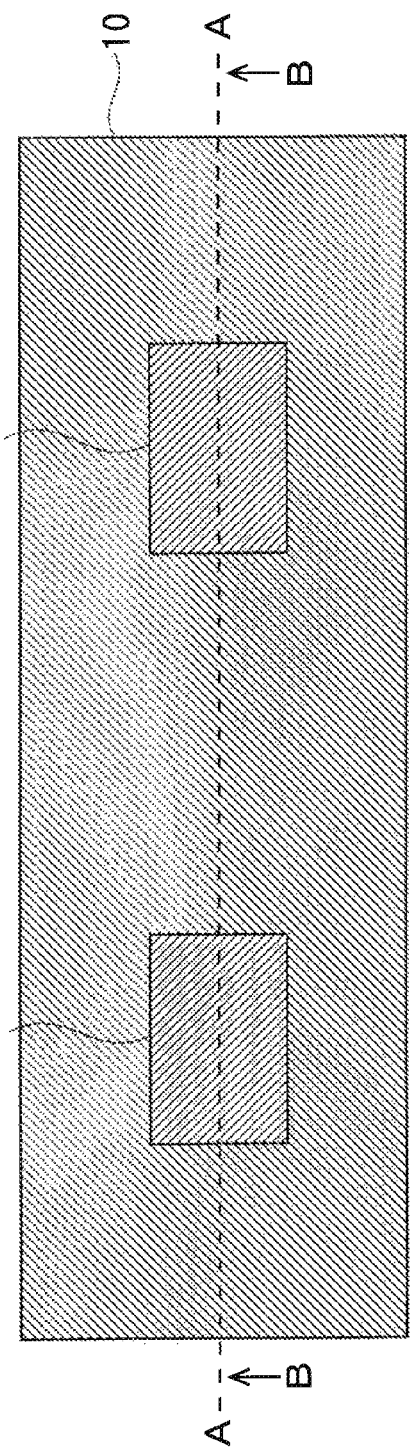
FIG. 7A is a top view illustrating the semiconductor device according to the first embodiment.
Figure 7B:
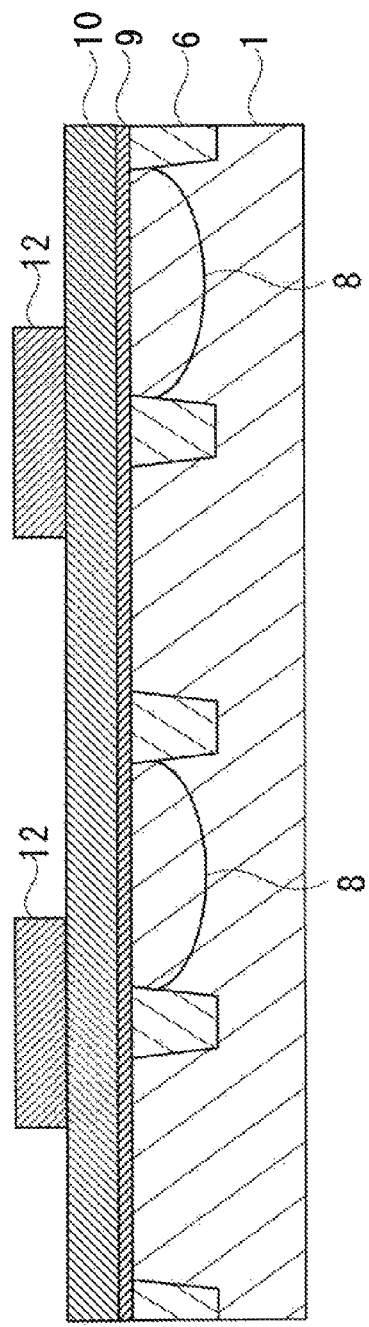
FIG. 7B is a cross sectional view illustrating the semiconductor device according to the first embodiment.

The metal film 11 is anisotropically etched using the resist pattern as a mask to form assist patterns 12 on the polysilicon film 10. After that, the resist pattern is removed. FIG. 7A is a top view illustrating the semiconductor device in the case where the assist patterns 12 are formed on the polysilicon film 10. FIG. 7B is a cross sectional view illustrating the semiconductor device in a case where a position indicated by a broken line "A" of FIG. 7A is viewed from a direction indicated by an arrow "B".

Next, as illustrated in FIGS. 8A and 8B, a metal film 13 having a film thickness of 20 nm to 30 nm is formed on the polysilicon film 10 and the assist patterns 12 by, for example, a CVD method or a CVD sputtering method. The metal film 13 is, for example, an oxide film, a nitride film, or a silicon oxide film. In this case, the metal film 13 is formed by evaporation on upper surfaces and side surfaces of the assist patterns 12 so as to cover the assist patterns 12. FIG. 8A is a top view illustrating the semiconductor device in the case where the metal film 13 is formed on the polysilicon film 10 and the assist patterns 12. FIG. 8B is a cross sectional view illustrating the semiconductor device in a case where a position indicated by a broken line "C" of FIG. 8A is viewed from a direction indicated by an arrow "D".

Then, as illustrated in FIGS. 9A and 9B, the metal film 13 is etched back to form hard mask patterns 14 on the side surfaces of the assist patterns 12. That is, side wall films of the metal films 13 are formed on the side surfaces of the assist patterns 12 to form the hard mask patterns 14 on the side surfaces of the assist patterns 12. Therefore, the hard mask patterns 14 are the metal films 13 having the side wall film shape. In FIG. 9A, the ring type hard mask patterns 14 are formed on the side surfaces of the assist patterns 12. FIG. 9A is a top view illustrating the semiconductor device in the case where the hard mask patterns 14 are formed on the side surfaces of the assist patterns 12. FIG. 9B is a cross sectional view illustrating the semiconductor device in a case where a position indicated by a broken line "E" of FIG. 9A is viewed from a direction indicated by an arrow "F".

Next, as illustrated in FIGS. 10A and 10B, the assist patterns 12 are removed. The assist patterns 12 may be removed by etching back or wet processing. FIG. 10A is a top view illustrating the semiconductor device in the case where the assist patterns 12 are removed. FIG. 10B is a cross sectional view illustrating the semiconductor device in a case where a position indicated by a broken line "G" of FIG. 10A is viewed from a direction indicated by an arrow "H".

Then, a photo resist film is formed on the polysilicon film 10 and the hard mask patterns 14 by, for example, a spin coating method. Next, the photo resist film is exposed using a cutting mask to form a resist pattern 15 on the polysilicon film 10 and the hard mask patterns 14 as illustrated in FIGS. 11A and 11B. That is, the resist pattern 15 is formed to partially cover and expose the polysilicon film 10 and the hard mask patterns 14. FIG. 11A is a top view illustrating the semiconductor device in the case where the resist pattern 15 is formed on the polysilicon film 10 and the hard mask patterns 14. FIG. 11B is a cross sectional view illustrating the semiconductor device in a case where a position indicated by a broken line "J" of FIG. 11A is viewed from a direction indicated by an arrow "I". As illustrated in FIG. 11A, portions of the hard mask patterns 14 which are to be cut (removed) are exposed and portions of the hard mask patterns 14 which are not to be cut (removed) are covered with the resist pattern 15.

Figure 12:
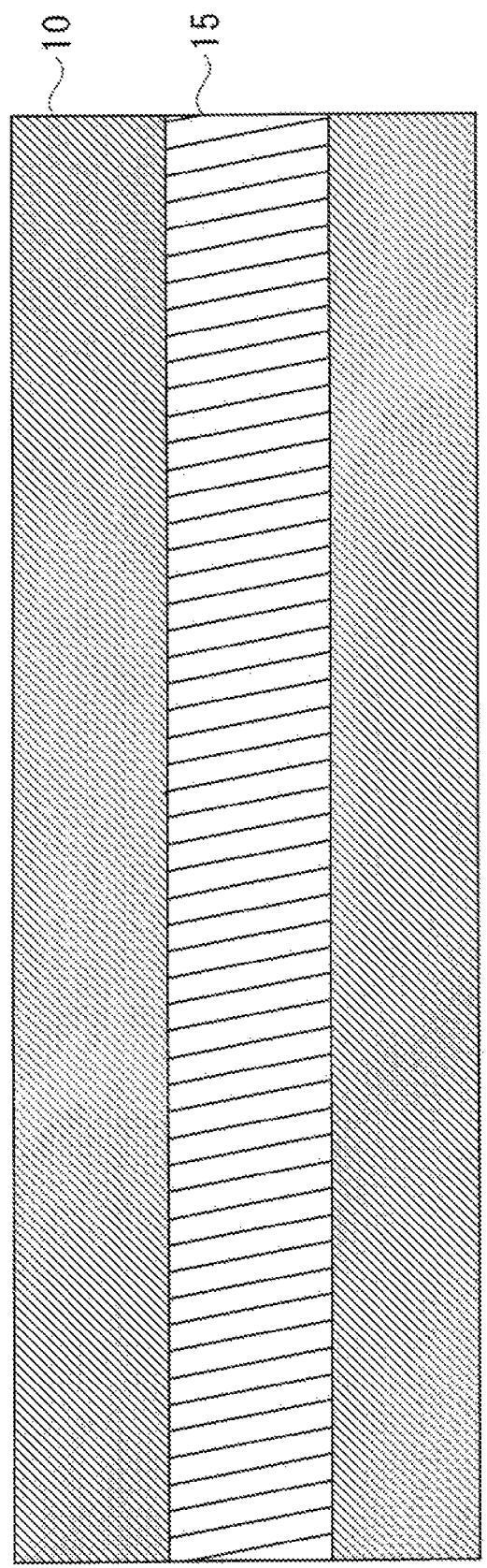
FIG. 12 is a top view illustrating the semiconductor device according to the first embodiment.

Then, the hard mask patterns 14 are etched using the resist pattern 15 as a mask to remove the exposed portions of the hardmask patterns 14 as illustrated in FIG. 12. That is, the portions of the hard mask patterns 14 which are exposed from the resist pattern 15 are removed. FIG. 12 is a top view illustrating the semiconductor device in the case where the exposed portions of the hard mask patterns 14 are removed.

Figure 13:
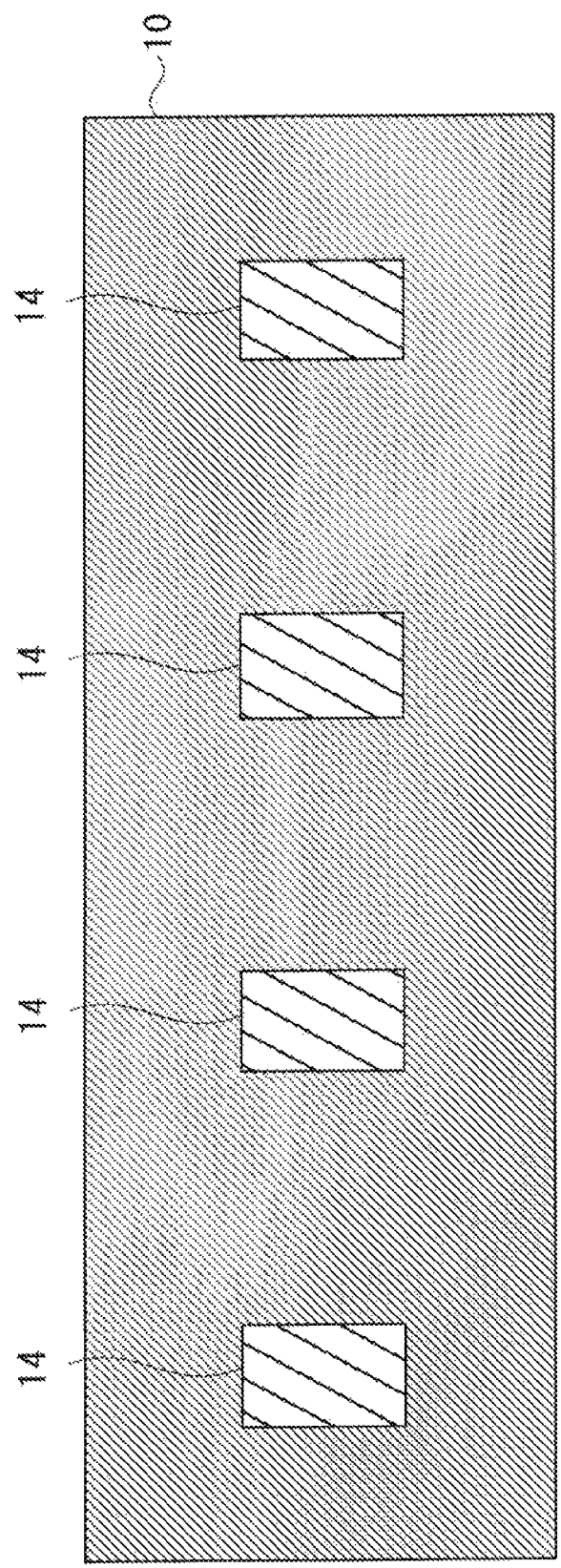
FIG. 13 is a top view illustrating the semiconductor device according to the first embodiment.

Next, as illustrated in FIG. 13, the resist pattern 15 is removed. The resist pattern 15 may be removed by etching back or wet processing. FIG. 13 is a top view illustrating the semiconductor device in the case where the resist pattern 15 is removed. As illustrated in FIG. 13, fine patterns of the hard mask patterns 14 are formed on the polysilicon film 10.

Figure 14:
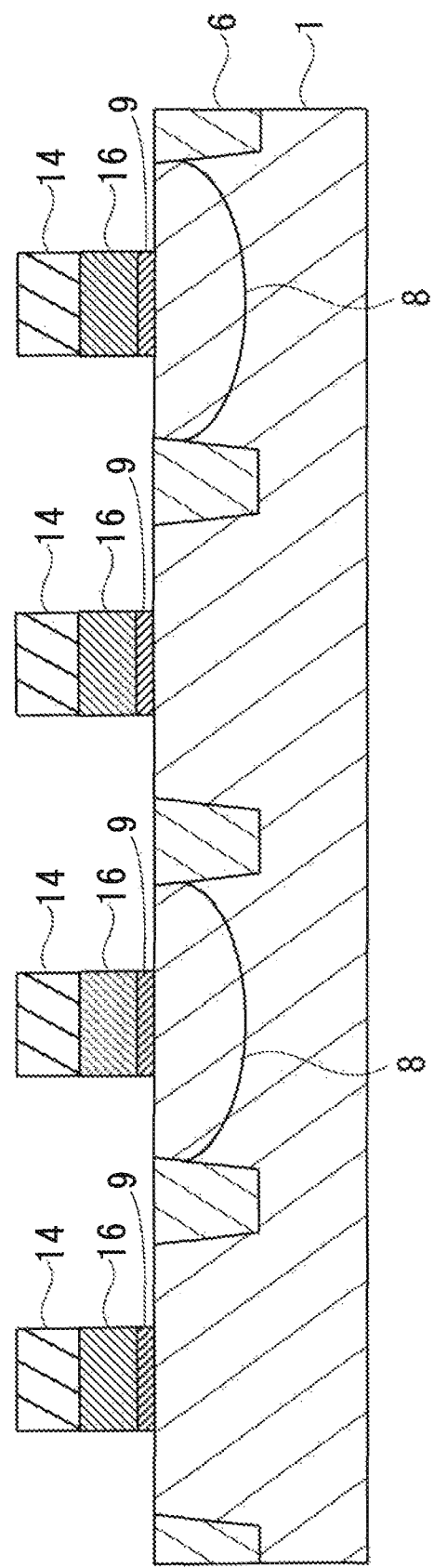
FIG. 14 is a cross sectional view illustrating the semiconductor device according to the first embodiment.

Then, the polysilicon film 10 is etched using the hard mask patterns 14 as masks to form gate electrodes 16 above the semiconductor substrate 1 as illustrated in FIG. 14. In this case, the gate electrodes 16 having a shape corresponding to the shape of the hard mask patterns 14 are formed above the semiconductor substrate 1. When the polysilicon film 10 is etched using the miniaturized hard mask patterns 14 as masks, the gate electrodes 16 may be miniaturized.

When the hardmask patterns 14 are formed using the assist patterns 12 and when the gate electrodes 16 are formed into a desired shape by using the hard mask patterns 14, the gate electrodes 16 may be miniaturized. Therefore, the assist pattern 12 serves as an assist pattern that assists the miniaturization of the gate electrodes 16. The assist pattern 12 is an assist pattern which is not included in a design layout.

Next, the hard mask patterns 14 provided on the gate electrodes 16 are removed. Then, a photo resist film is formed above the semiconductor substrate 1 by, for example, a spin coating method. Then, the photo resist film is patterned using a photolithography technology to form a resist pattern 17. In this case, the resist pattern 17 is formed so as to cover the element regions "B" and "D".

Figure 15:
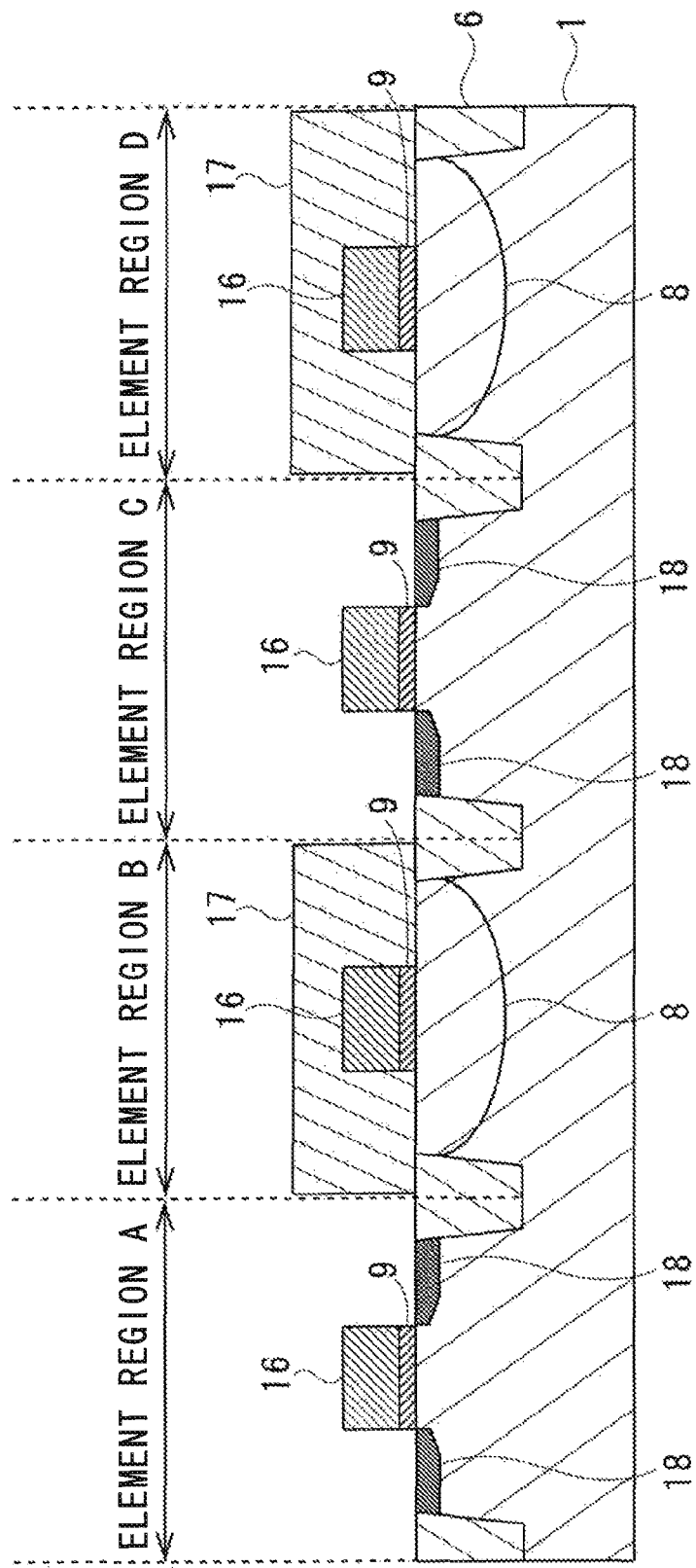
FIG. 15 is a cross sectional view illustrating the semiconductor device according to the first embodiment.

Then, as illustrated in FIG. 15, p-type lightly doped drain (LDD) regions 18 are formed. Specifically, p-type impurities are implanted into the semiconductor substrate 1 using the gate electrodes 16 and the resist pattern 17 as masks to form the p-type LDD regions 18. For example, boron (B) is used as the p-type impurity. After that, the resist pattern 17 is removed.

Then, a photo resist film is formed above the semiconductor substrate 1 by, for example, a spin coating method. Then, the photo resist film is patterned using a photolithography technology to form a resist pattern 19. In this case, the resist pattern 19 is formed so as to cover the element regions "A" and "C".

Figure 16:
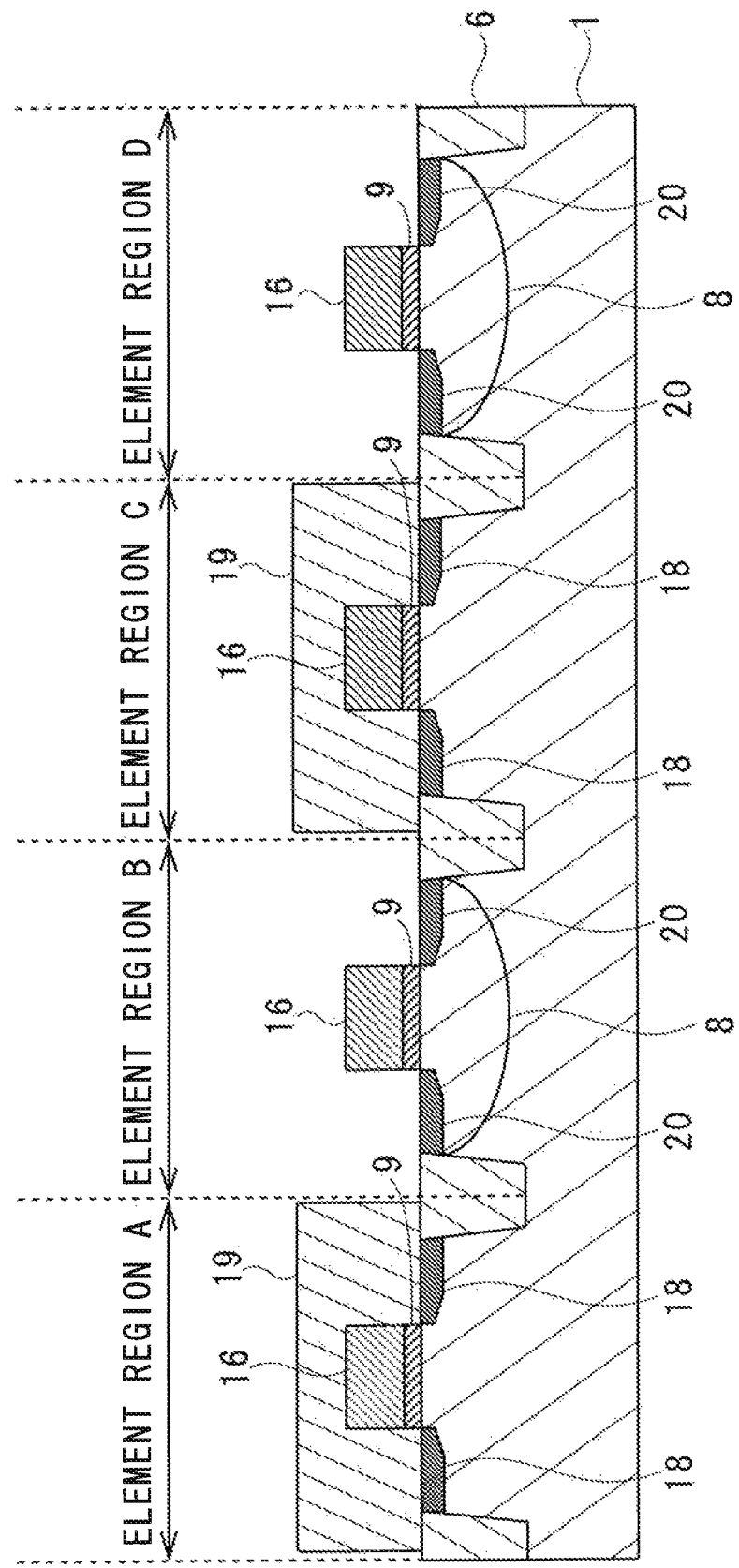
FIG. 16 is a cross sectional view illustrating the semiconductor device according to the first embodiment.

Then, as illustrated in FIG. 16, n-type LDD regions 20 are formed. Specifically, n-type impurities are implanted into the semiconductor substrate 1 using the gate electrodes 16 and the resist pattern 19 as masks to form the n-type LDD regions 20. For example, phosphorus (P) is used as the n-type impurity. After that, the resist pattern 19 is removed.

Next, a silicon oxide film is deposited above the semiconductor substrate 1 so as to cover the gate electrodes 16. For example, when a CVD method is used, the silicon oxide film may be deposited above the semiconductor substrate 1. Then, the silicon oxide film is anisotropically dry-etched (etched back). When the anisotropic dry etching (etching back) is performed, side wall insulating films 21 are formed on side walls of the gate electrodes 16.

Then, a photo resist film is formed above the semiconductor substrate 1 by, for example, a spin coating method. Then, the photo resist film is patterned using a photolithography technology to form a resist pattern 22. In this case, the resist pattern 22 is formed so as to cover the element regions "B" and "D".

Figure 17:
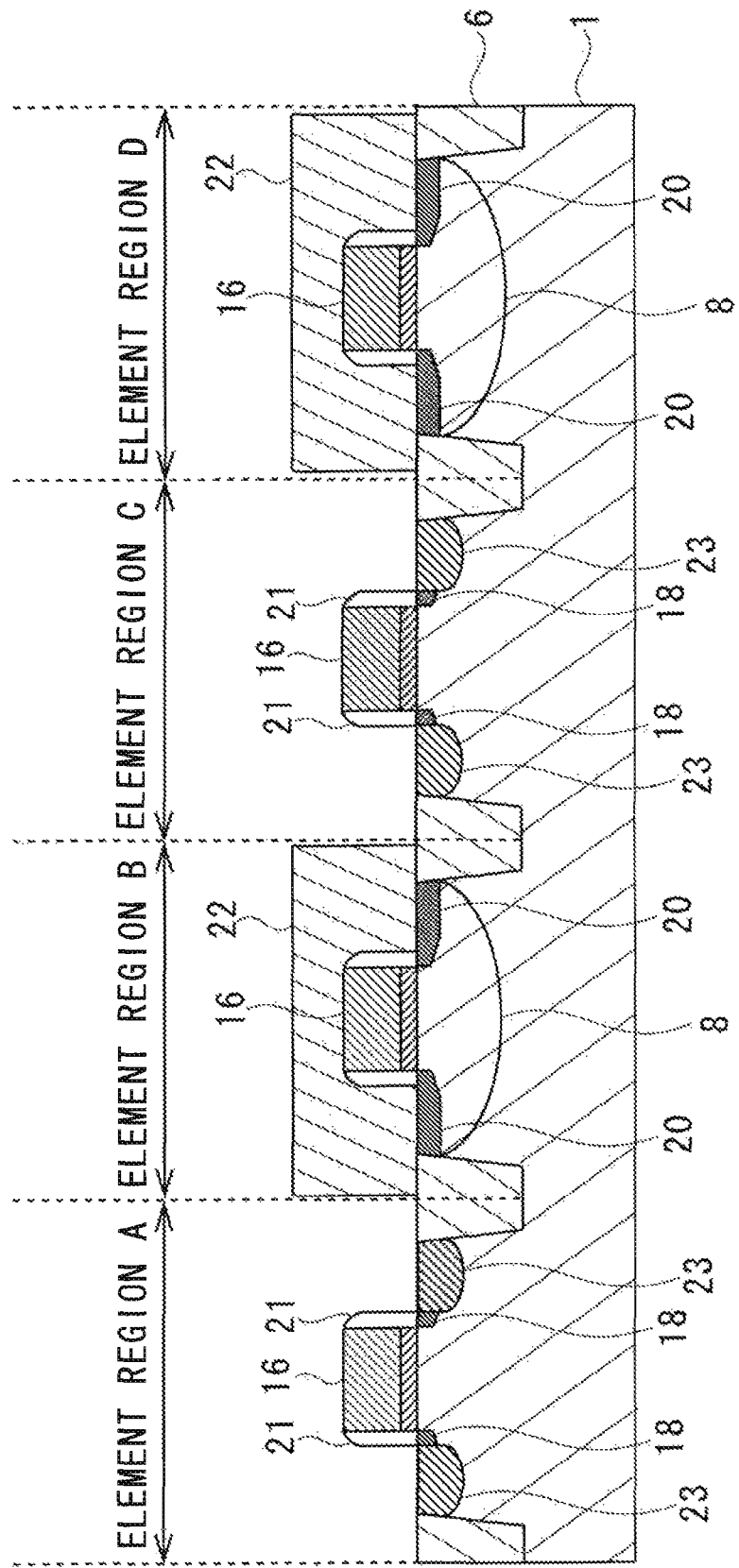
FIG. 17 is a cross sectional view illustrating the semiconductor device according to the first embodiment.

Next, as illustrated in FIG. 17, source/drain regions 23 are formed. Specifically, p-type impurities are implanted into the semiconductor substrate 1 using the gate electrodes 16, the side wall insulating films 21, and the resist pattern 22 as masks to form the source/drain regions 23. For example, p-type impurities are implanted at a higher impurity concentration than the impurity concentration of the p-type LDD regions 18 to form the source/drain regions 23 superimposing with parts of the p-type LDD regions 18. For example, boron (B) is used as the p-type impurity. After that, the resist pattern 22 is removed.

Then, a photo resist film is formed above the semiconductor substrate 1 by, for example, a spin coating method. Then, the photo resist film is patterned using a photolithography technology to form a resist pattern 24. In this case, the resist pattern 24 is formed so as to cover the element regions "A" and "C".

Figure 18:
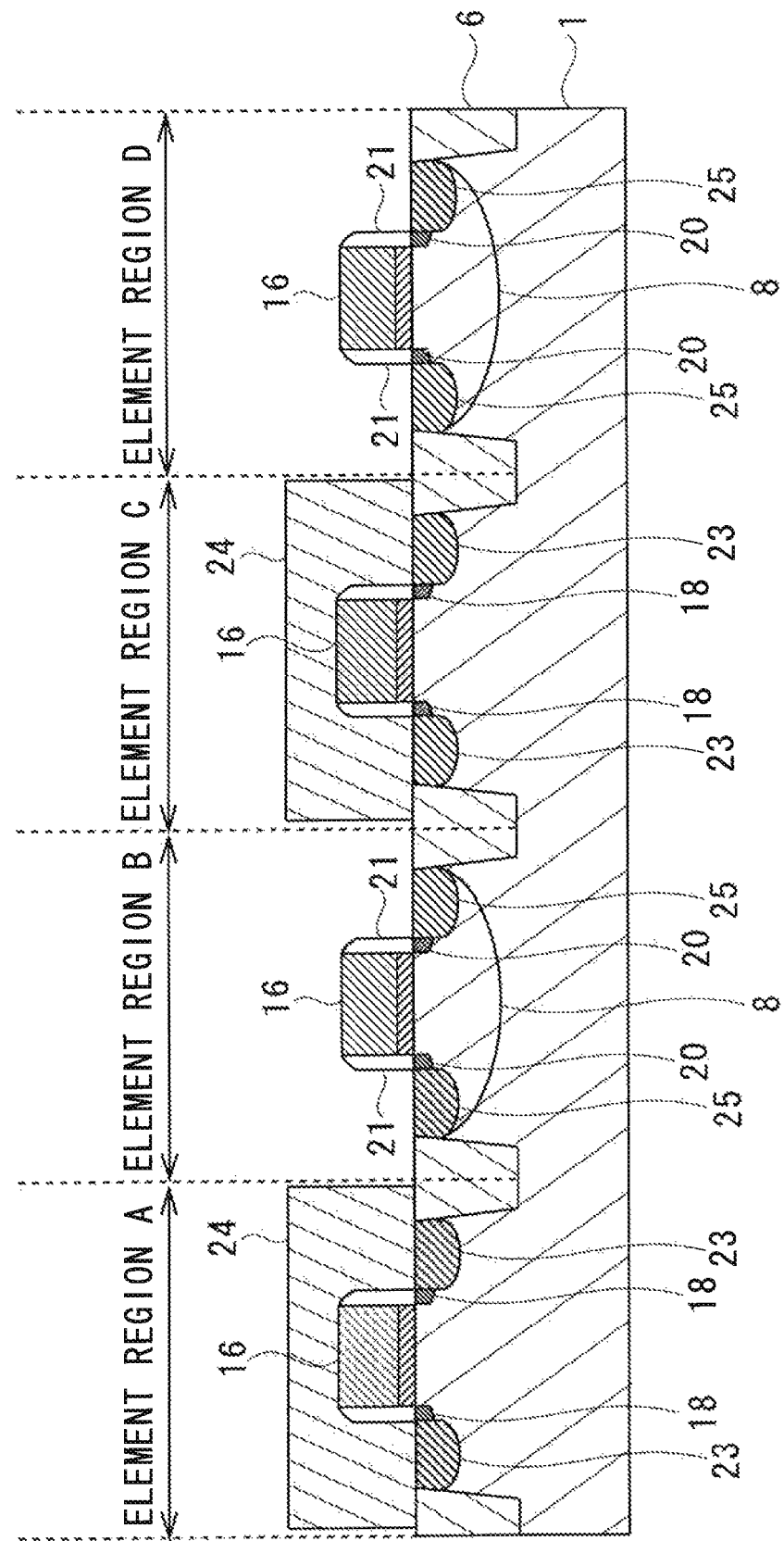
FIG. 18 is a cross sectional view illustrating the semiconductor device according to the first embodiment.

Next, as illustrated in FIG. 18, source/drain regions 25 are formed. Specifically, n-type impurities are implanted into the semiconductor substrate 1 using the gate electrodes 16, the side wall insulating films 21, and the resist pattern 24 as masks to form the source/drain regions 25. For example, n-type impurities are implanted at a higher impurity concentration than the impurity concentration of the n-type LDD regions 20 to form the source/drain regions 25 superimposing with parts of the p-type LDD regions 20. For example, phosphorus (P) is used as the n-type impurity. After that, the resist pattern 24 is removed.

Figure 19:
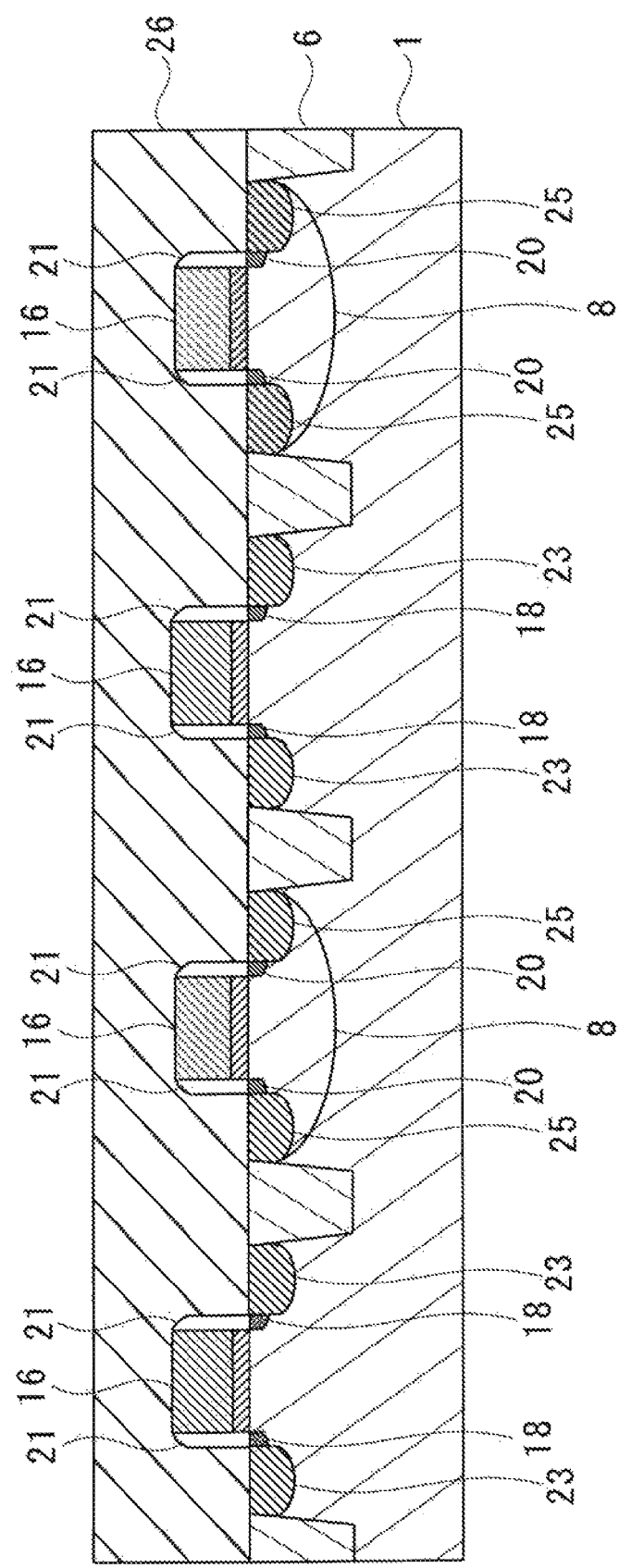
FIG. 19 is a cross sectional view illustrating the semiconductor device according to the first embodiment.

Then, as illustrated in FIG. 19, an interlayer insulating film 26 is formed above the semiconductor substrate 1 and planarized by a CMP method. The interlayer insulating film 26 is, for example, a silicon oxide film. The interlayer insulating film 26 may be formed by a CVD method using a silane gas and an oxygen gas.

Figure 20:
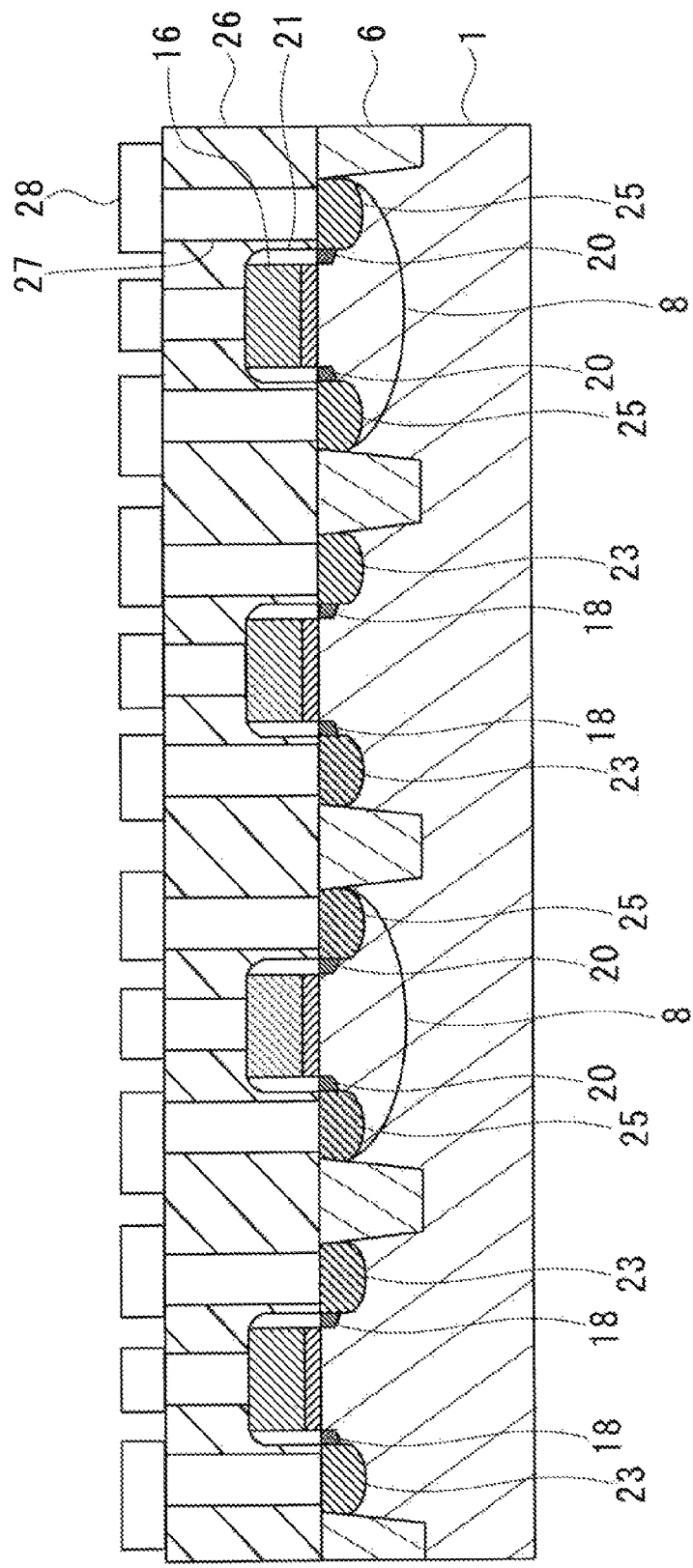
FIG. 20 is a cross sectional view illustrating the semiconductor device according to the first embodiment.

Next, as illustrated in FIG. 20, contacts 27 and wirings 28 are formed. Specifically, contact holes are formed in the interlayer insulating film 26 by photolithography and etching. After that, for example, tungsten (W) is deposited on the interlayer insulating film 26 and polished by a CMP method to form the contacts 27 in the interlayer insulating film 26. Then, metal such as aluminum (Al) or copper (Cu) is deposited on the interlayer insulating film 26 and photolithography and etching are performed to form the wirings 28 on the interlayer insulating film 26.

Figure 21:
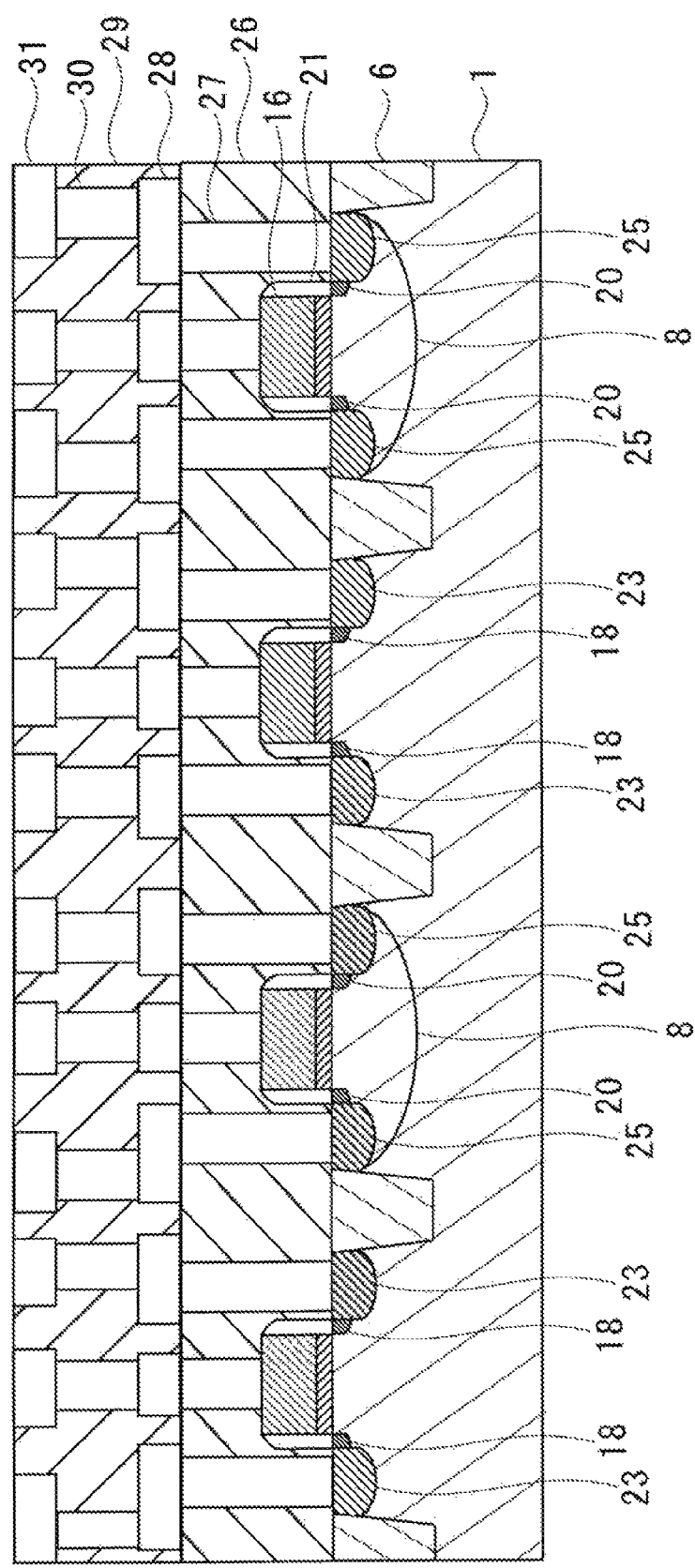
FIG. 21 is a cross sectional view illustrating the semiconductor device according to the first embodiment.

Next, as illustrated in FIG. 21, an interlayer insulating film 29, contacts 30, and wirings 31 are formed. Specifically, the interlayer insulating film 29 is formed on the wirings 28 and planarized by a CMP method. The interlayer insulating film 29 is, for example, a silicon oxide film. The interlayer insulating film 29 may be formed on the wirings 28 by a CVD method using a silane gas and an oxygen gas. The contacts 30 and the wirings 31 are formed in the same manner as the contacts 27 and the wirings 28.

As described above, when the interlayer insulating film 29, the contacts 30, and the wirings 31 are formed, a multilayer wiring may be formed. If necessary, the step of forming the interlayer insulating layer and the wiring layers may be repeated.

Second Embodiment

A semiconductor device and a manufacturing method therefor according to a second embodiment are described with reference to FIGS. 22 to 44. Note that the same constituent elements are expressed by the same reference symbols as in the first embodiment and the description thereof is omitted. FIGS. 1 to 21 are referred to if necessary.

The first embodiment describes the technology associated with the miniaturization of the gate electrodes 16. In the second embodiment, a technology associated with the miniaturization of the gate electrodes 16 and contact regions is described. Each of the contact regions is a region for efficiently connecting an upper layer electrode to a lower layer electrode. Each of the contact regions requires a size including a size of a contact that contacts the upper layer electrode with the lower layer electrode in order to prevent leakage to adjacent electrodes and increase a margin for a positional deviation of overlap exposure.

Figure 22:
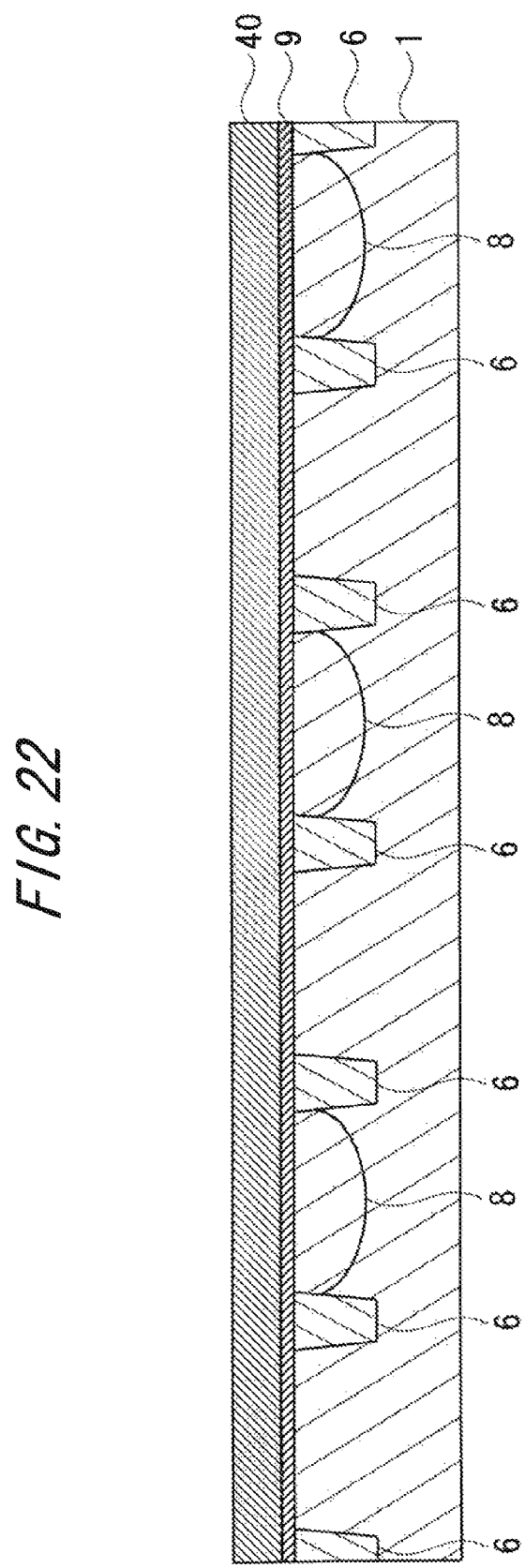
FIG. 22 is a cross sectional view illustrating a semiconductor device according to a second embodiment.

In the semiconductor device manufacturing method according to the second embodiment, as illustrated in FIG. 22, a polysilicon film 40 is formed above the semiconductor substrate 1. Note that a process up to the formation of the polysilicon film 40 above the semiconductor substrate 1 is identical to the process up to the formation of the polysilicon film 10 above the semiconductor substrate 1 in the semiconductor device manufacturing method according to the first embodiment.

Figure 23:
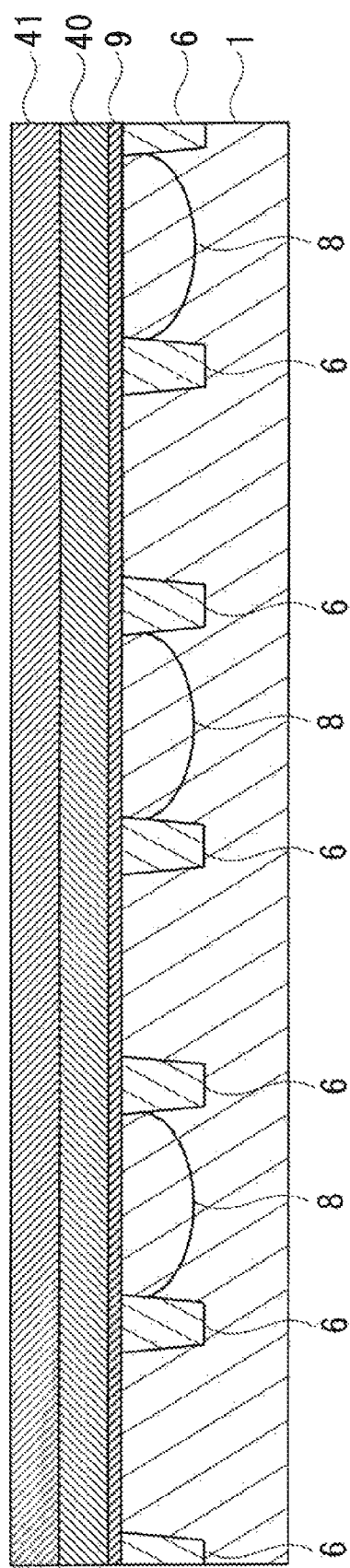
FIG. 23 is a cross sectional view illustrating the semiconductor device according to the second embodiment.

Next, as illustrated in FIG. 23, a metal film 41 having a film thickness of 80 nm to 120 nm is formed on the polysilicon film 40 by, for example, a CVD method or a CVD sputtering method. The metal film 41 is, for example, a polysilicon film.

Then, a photo resist film is formed on the metal film 41 by, for example, a spin coating method. In this case, multi-level resist stack coat (for example, one is the combination of photo-resist and barc, the other is the combination of photo-resist, upper layer resist, and lower layer resist) might be used. Next, the photo resist film is patterned by a photolithography technology to form a resist pattern on the metal film 41.

Figure 24:
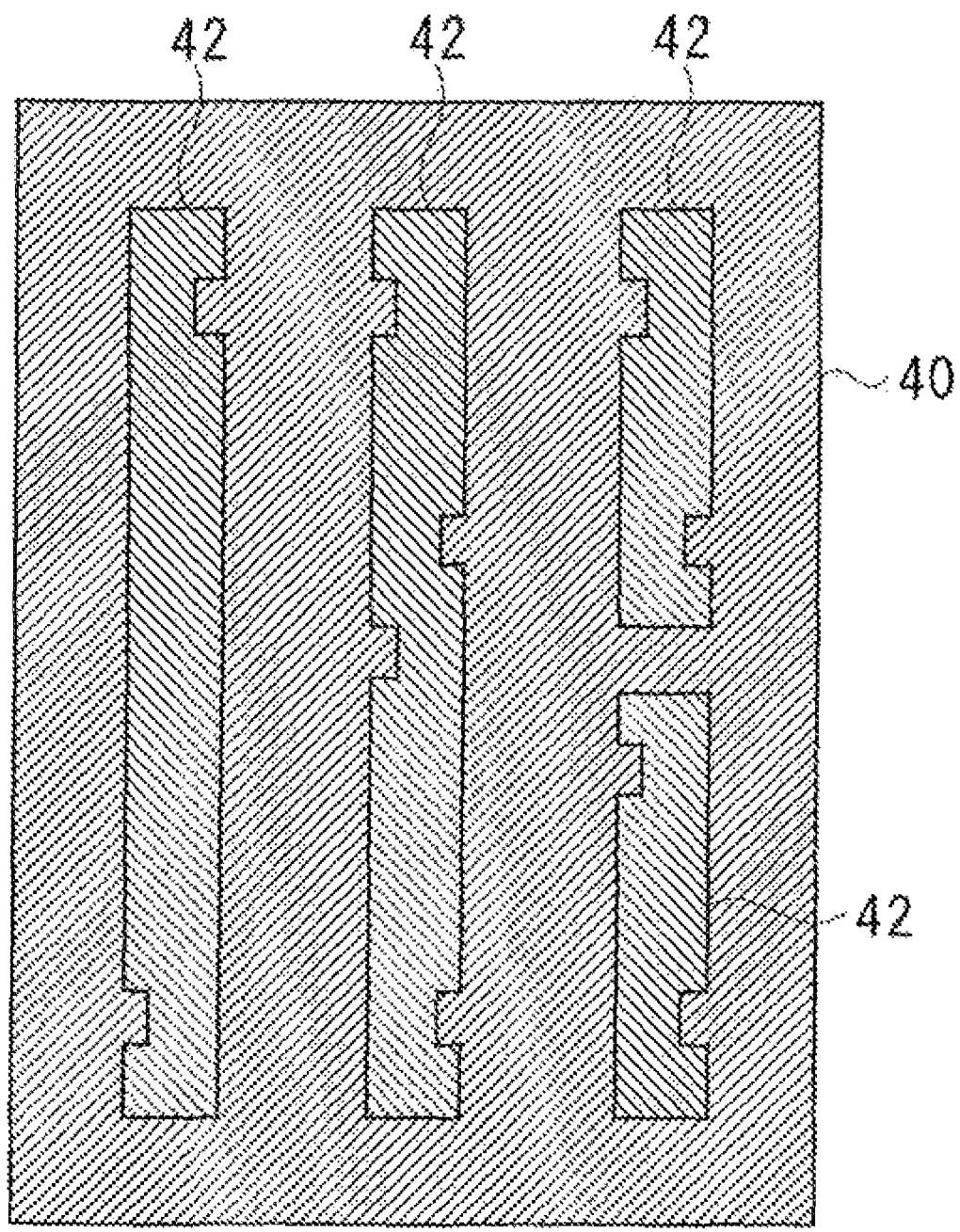
FIG. 24 is a top view illustrating the semiconductor device according to the second embodiment.

The metal film 41 is anisotropically etched using the resist pattern as a mask to form assist patterns 42 on the polysilicon film 40. After that, the resist pattern is removed. FIG. 24 is a top view illustrating the semiconductor device in the case where the assist patterns 42 are formed on the polysilicon film 40.

Figure 25:
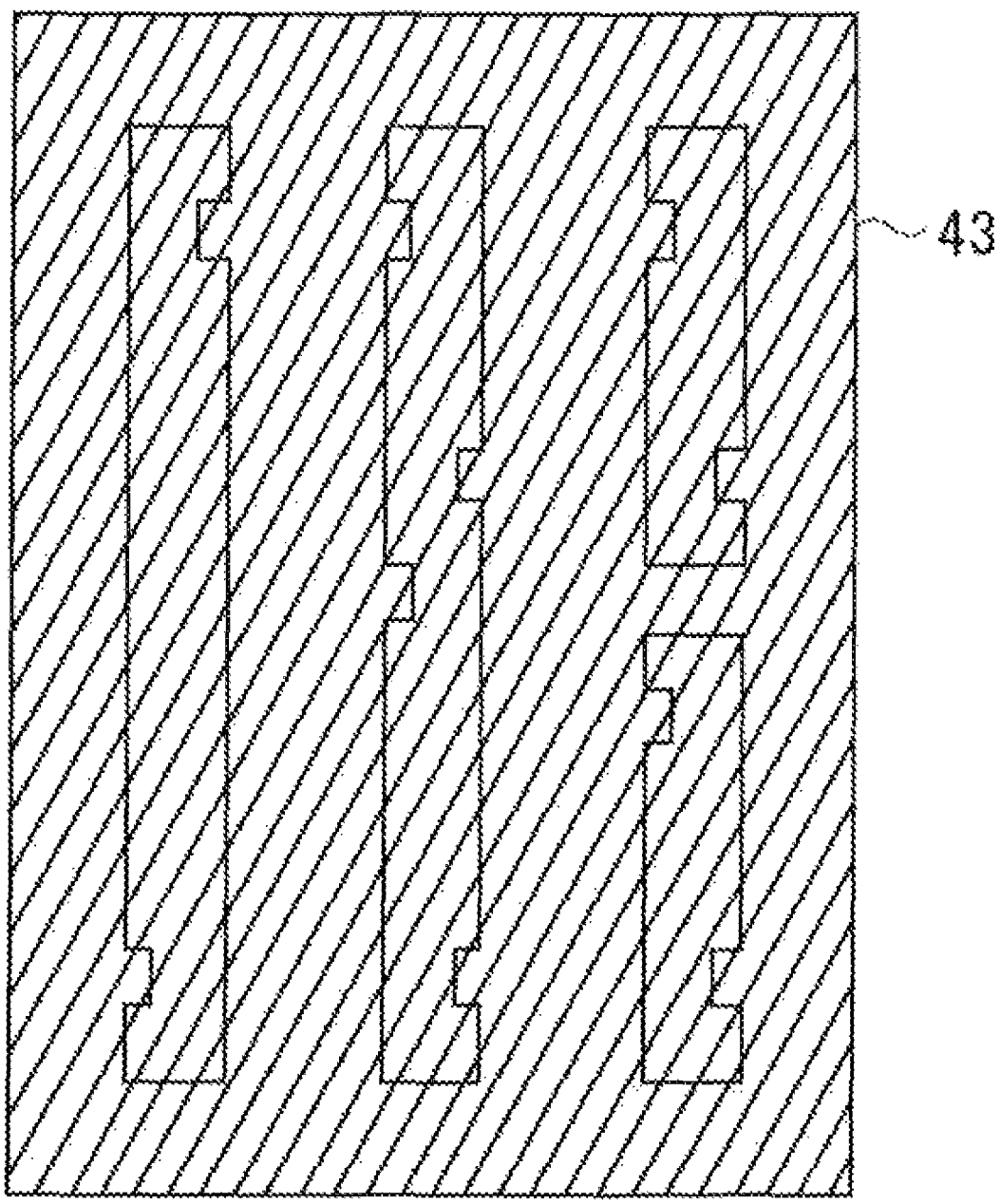
FIG. 25 is a top view illustrating the semiconductor device according to the second embodiment.

Next, as illustrated in FIG. 25, a metal film 43 having a film thickness of 20 nm to 30 nm is formed on the polysilicon film 40 and the assist patterns 42 by, for example, a CVD method or a CVD sputtering method. The metal film 43 is, for example, an oxide film, a nitride film, or a silicon oxide film. In this case, the metal film 43 is formed by evaporation on upper surfaces and side surfaces of the assist patterns 42 so as to cover the assist patterns 42. FIG. 25 is a top view illustrating the semiconductor device in the case where the metal film 43 is formed on the polysilicon film 40 and the assist patterns 42.

Figure 26:
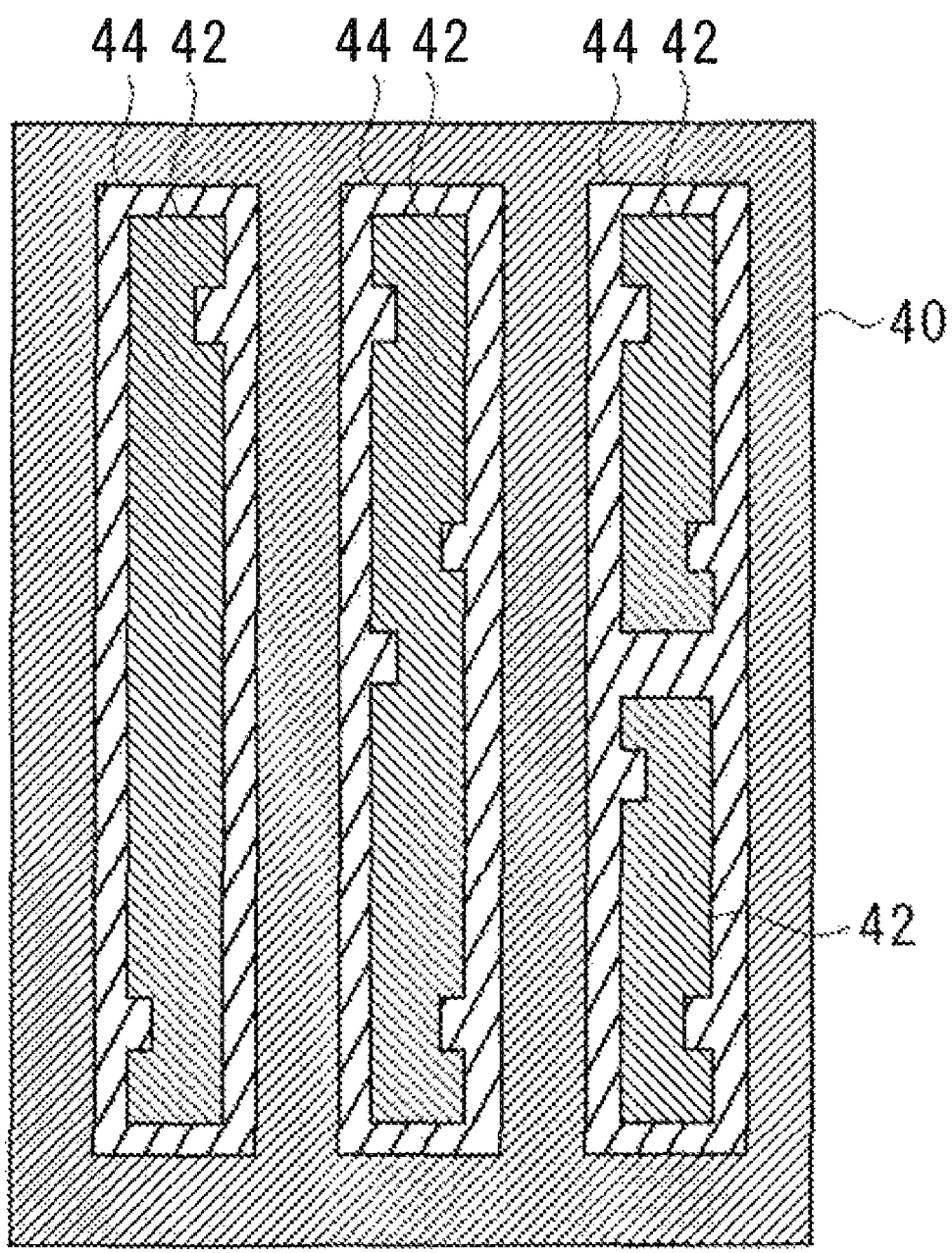
FIG. 26 is a top view illustrating the semiconductor device according to the second embodiment.

Then, as illustrated in FIG. 26, the metal film 43 is etched back to form hard mask patterns 44 on the side surfaces of the assist patterns 42. That is, side wall films of the metal films 43 are formed on the side surfaces of the assist patterns 42 to form the hard mask patterns 44 on the side surfaces of the assist patterns 42. Therefore, the hard mask patterns 44 are the metal films 43 having the side wall film shape. FIG. 26 is a top view illustrating the semiconductor device in the case where the hard mask patterns 44 are formed on the side surfaces of the assist patterns 42.

Figure 27:
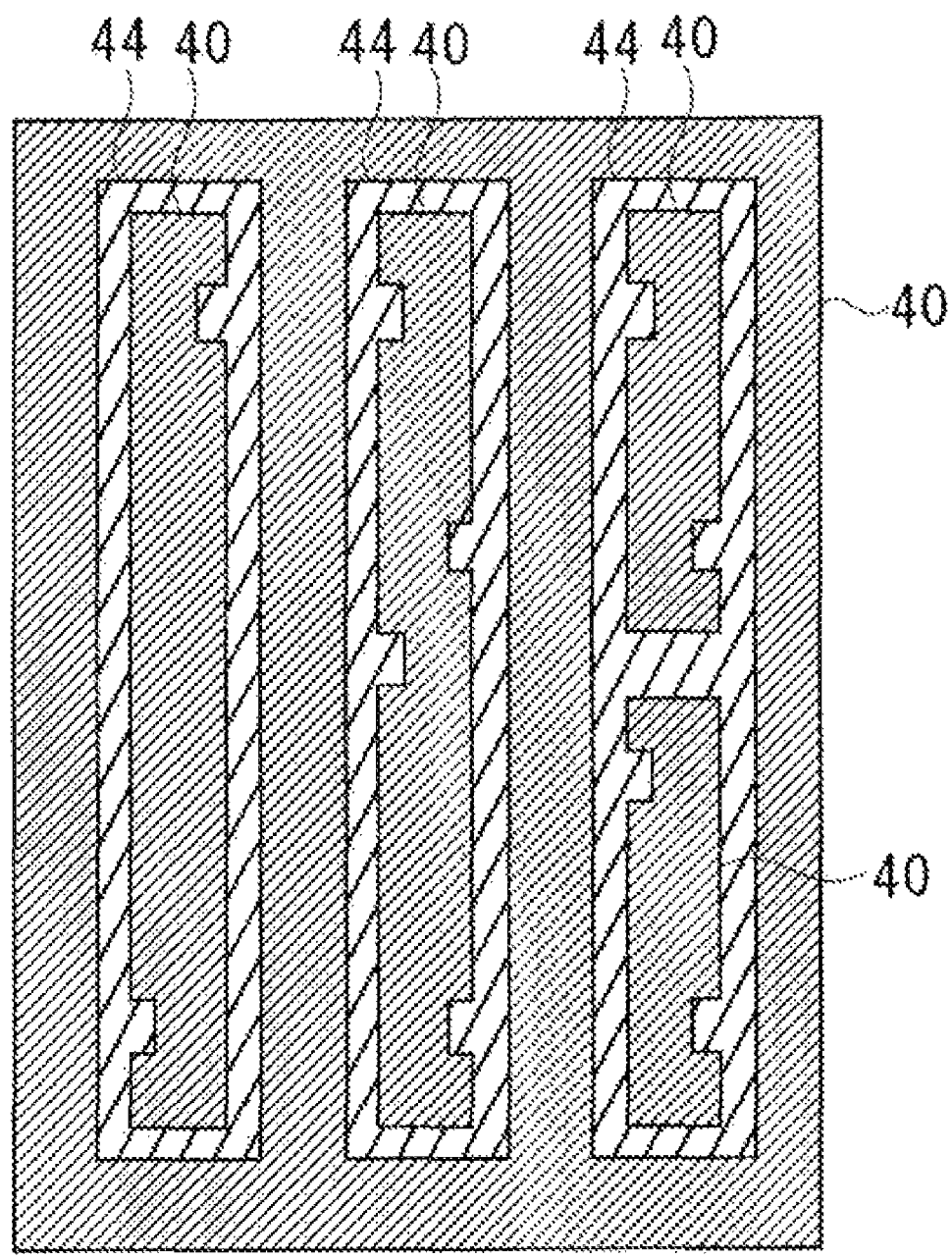
FIG. 27 is a top view illustrating the semiconductor device according to the second embodiment.

Next, as illustrated in FIG. 27, the assist patterns 42 are removed. The assist patterns 42 may be removed by etching back or wet processing. FIG. 27 is a top view illustrating the semiconductor device in the case where the assist patterns 42 are removed.

Figure 28:
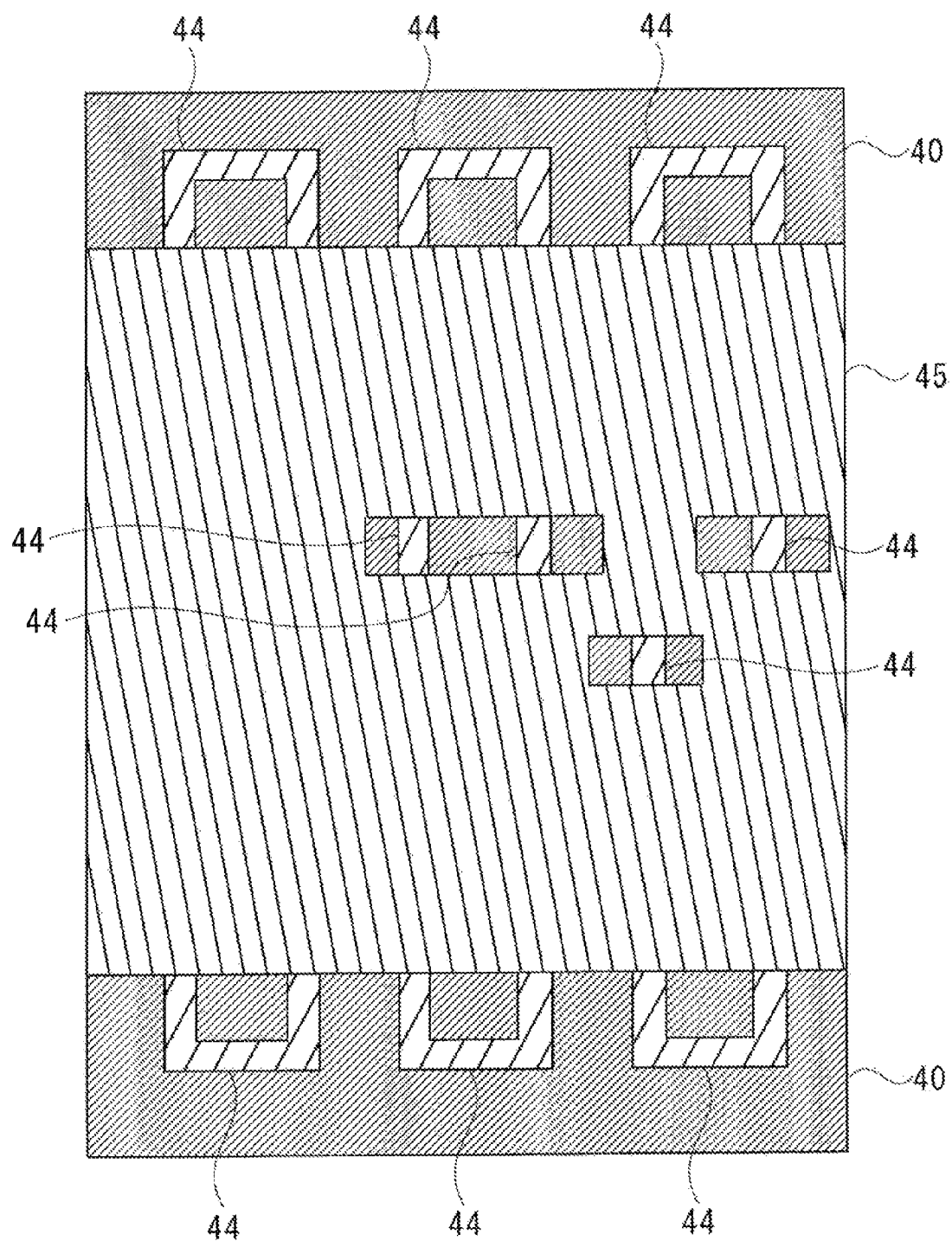
FIG. 28 is a top view illustrating the semiconductor device according to the second embodiment.

Then, a photo resist film is formed on the polysilicon film 40 and the hard mask patterns 44 by, for example, a spin coating method. In this case, multi-level resist stack coat (for example, one is the combination of photo-resist and barc, the other is the combination of photo-resist, upper layer resist, and lower layer resist) might be used. Next, the photo resist film is exposed using a cutting mask to form a resist pattern 45 on the polysilicon film 40 and the hard mask patterns 44 as illustrated in FIG. 28. That is, the resist pattern 45 is formed to partially cover and expose the polysilicon film 40 and the hard mask patterns 44. FIG. 28 is a top view illustrating the semiconductor device in the case where the resist pattern 45 is formed on the polysilicon film 40 and the hard mask patterns 44. As illustrated in FIG. 28, portions of the hard mask patterns 44 which are to be cut (removed) are exposed and portions of the hard mask patterns 44 which are not to be cut (removed) are covered with the resist pattern 45.

Figure 29:
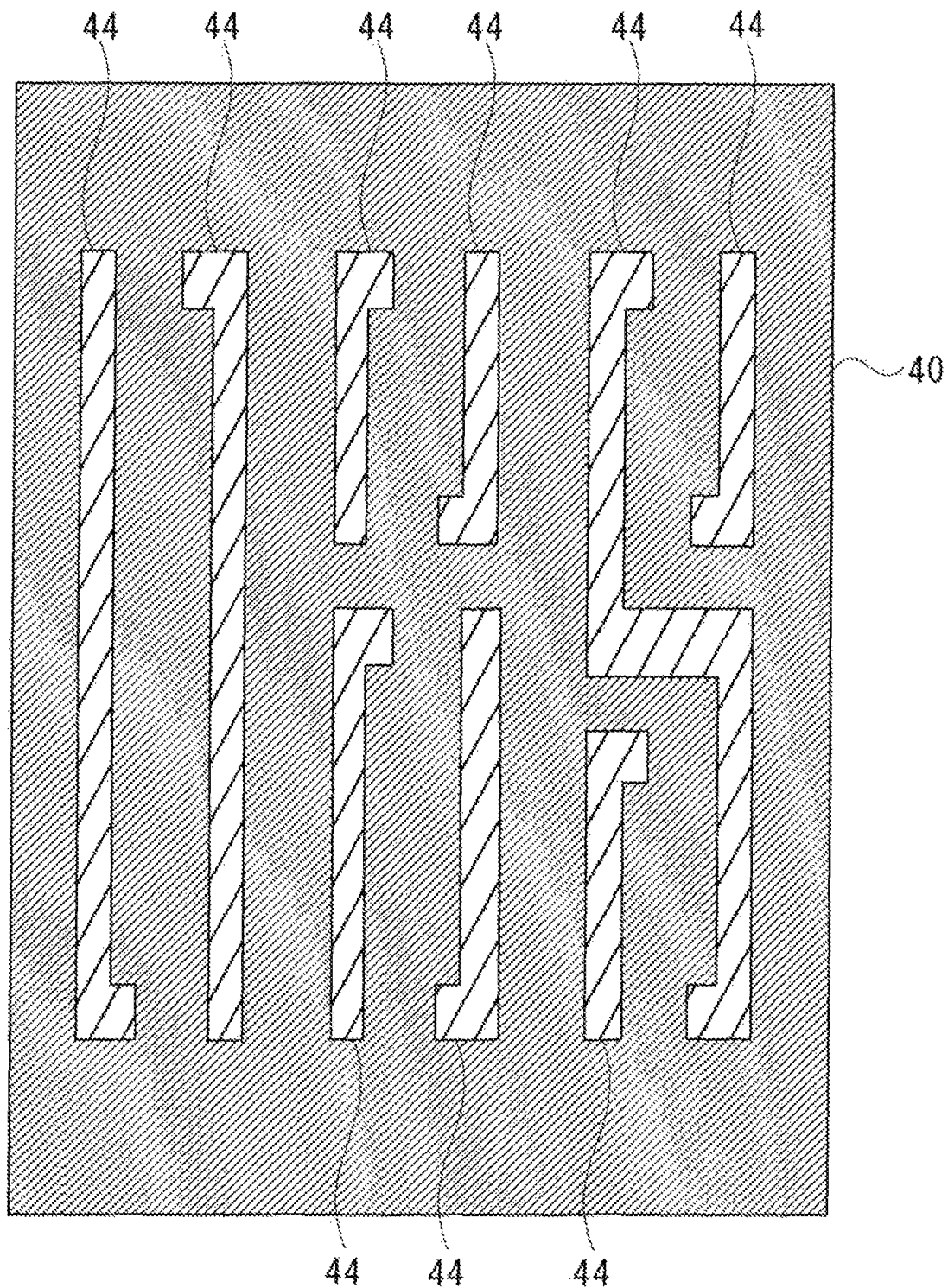
FIG. 29 is a top view illustrating the semiconductor device according to the second embodiment.

Next, the hard mask patterns 44 are etched using the resist pattern 45 as a mask to remove the exposed portions of the hardmask patterns 44. That is, the portions of the hard mask patterns 44 which are exposed from the resist pattern 45 are removed. Then, the resist pattern 45 is removed. The resist pattern 45 may be removed by etching back or wet processing. FIG. 29 is a top view illustrating the semiconductor device in the case where the resist pattern 45 is removed. As illustrated in FIG. 29, the exposed portions of the hard mask patterns 44 is removed, and hence fine patterns of the hard mask patterns 44 are formed on the polysilicon film 40.

Figure 30:
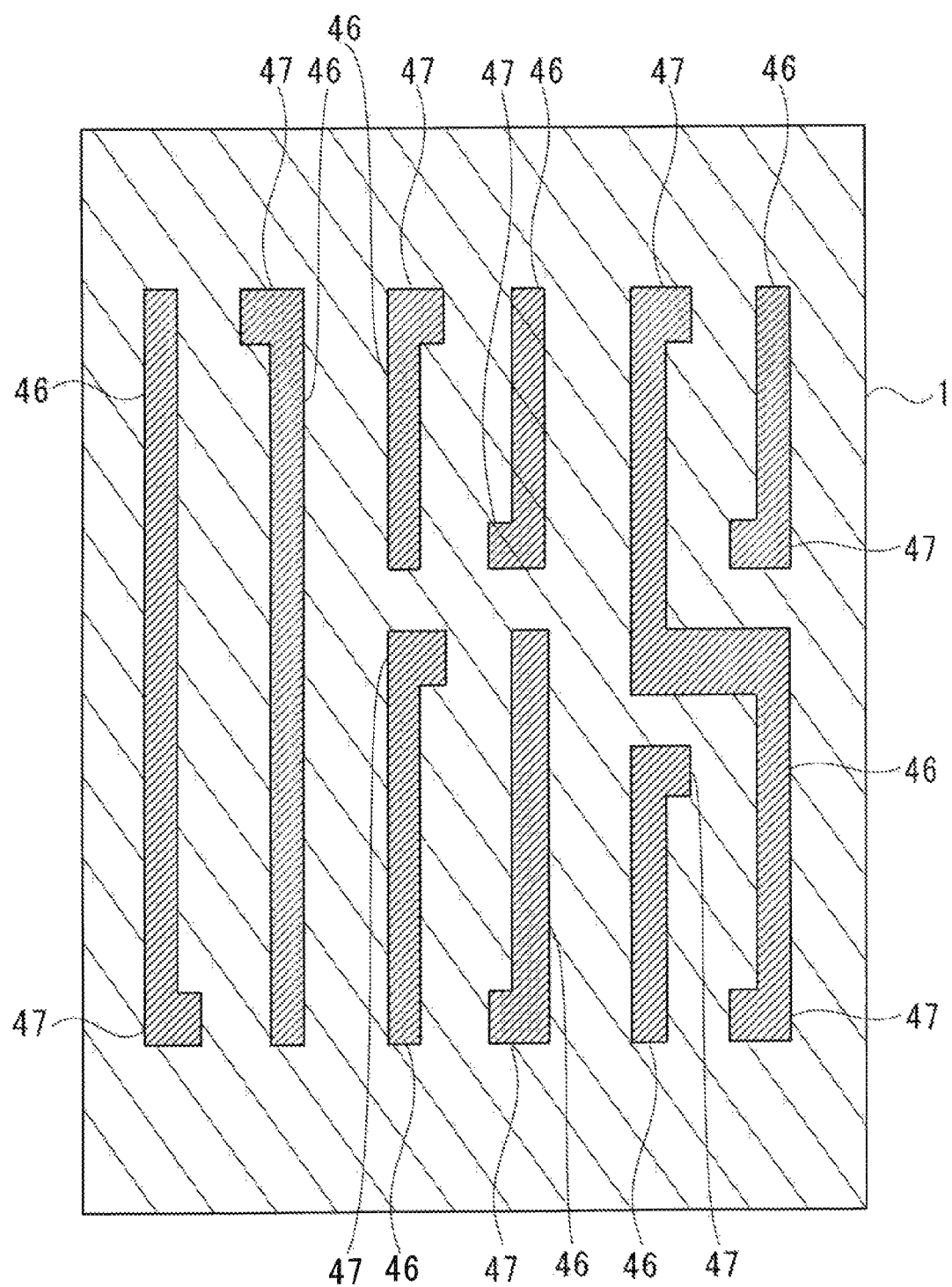
FIG. 30 is a top view illustrating the semiconductor device according to the second embodiment.

Then, the polysilicon film 40 is etched using the hard mask patterns 44 as masks to form gate electrodes 46 and contact regions 47 electrically connected to the gate electrodes 46 above the semiconductor substrate 1 as illustrated in FIG. 30. In this case, the gate electrodes 46 and the contact regions 47 having a shape corresponding to the shape of the hard mask patterns 44 are formed above the semiconductor substrate 1. When the polysilicon film 40 is etched using the miniaturized hard mask patterns 44 as masks, the miniaturized gate electrodes 46 may be formed. In addition, when the polysilicon film 40 is etched using the miniaturized hard mask patterns 44 as masks, the miniaturized contact regions 47 may be formed.

When the hardmask patterns 44 are formed using the assist patterns 42 and when the gate electrodes 46 and the contact regions 47 are formed into a desired shape by using the hard mask patterns 44, the gate electrodes 46 and the contact regions 47 may be miniaturized. Therefore, the assist pattern 42 serves as an assist pattern that assists the miniaturization of the gate electrodes 46 and the contact regions 47. The assist pattern 42 is an assist pattern which is not included in a design layout.

A process of the semiconductor device manufacturing method after the gate electrodes 46 and the contact regions 47 are formed above the semiconductor substrate 1 is identical to the process of the semiconductor device manufacturing method according to the first embodiment.

Figure 31:
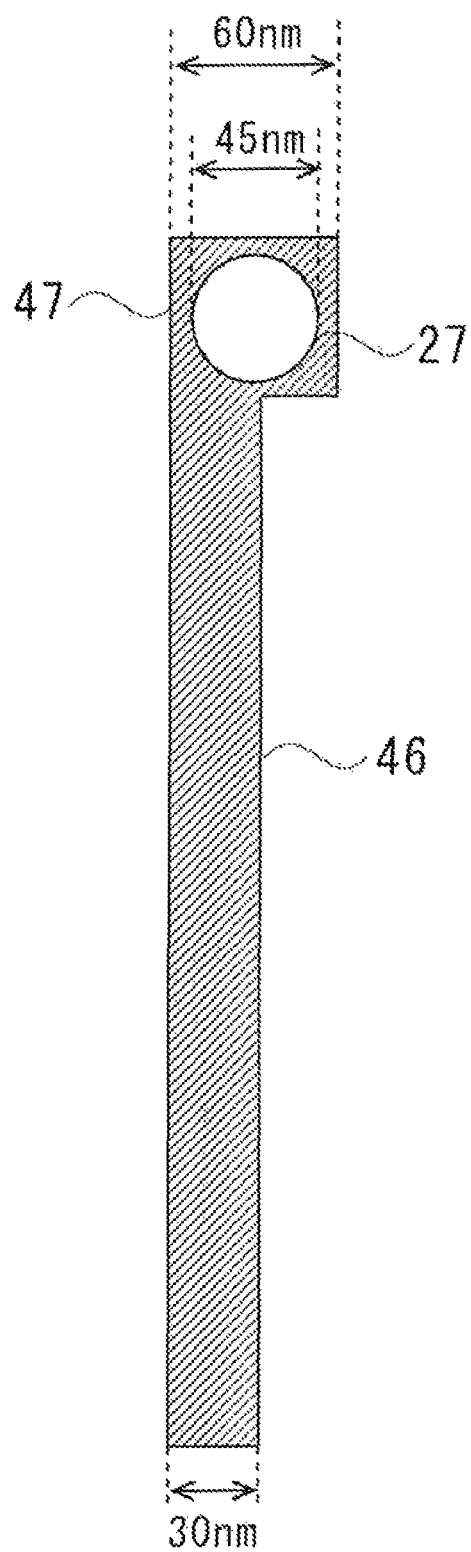
FIG. 31 is a view illustrating a gate electrode, a contact region, and a contact.

FIG. 31 illustrates the gate electrode 46, the contact region 47, and a contact 27 formed on the contact region 47. In FIG. 31, for example, the contact region 47 has longitudinal and lateral widths of 60 nm, the gate electrode 46 has a lateral width of 30 nm, the contact 27 has a diameter ($\phi$) of 45 nm, and the amount of area surrounding the contact 27 on the contact region 47 is 7.5 nm. As illustrated in FIG. 31, a bottom portion of the contact 27 is incomplete contact with the contact region 47, and hence a contact area of the bottom portion of the contact 27 is 100%.

Next, shapes of the assist patterns 42 are described. The assist patterns 42 are formed on the polysilicon film 40 in order to form the miniaturized hard mask patterns 44. Therefore, in a layout design for the semiconductor device, the shapes of the assist patterns 42 are designed to form the hard mask patterns 44 into desired shapes.

Figure 32:
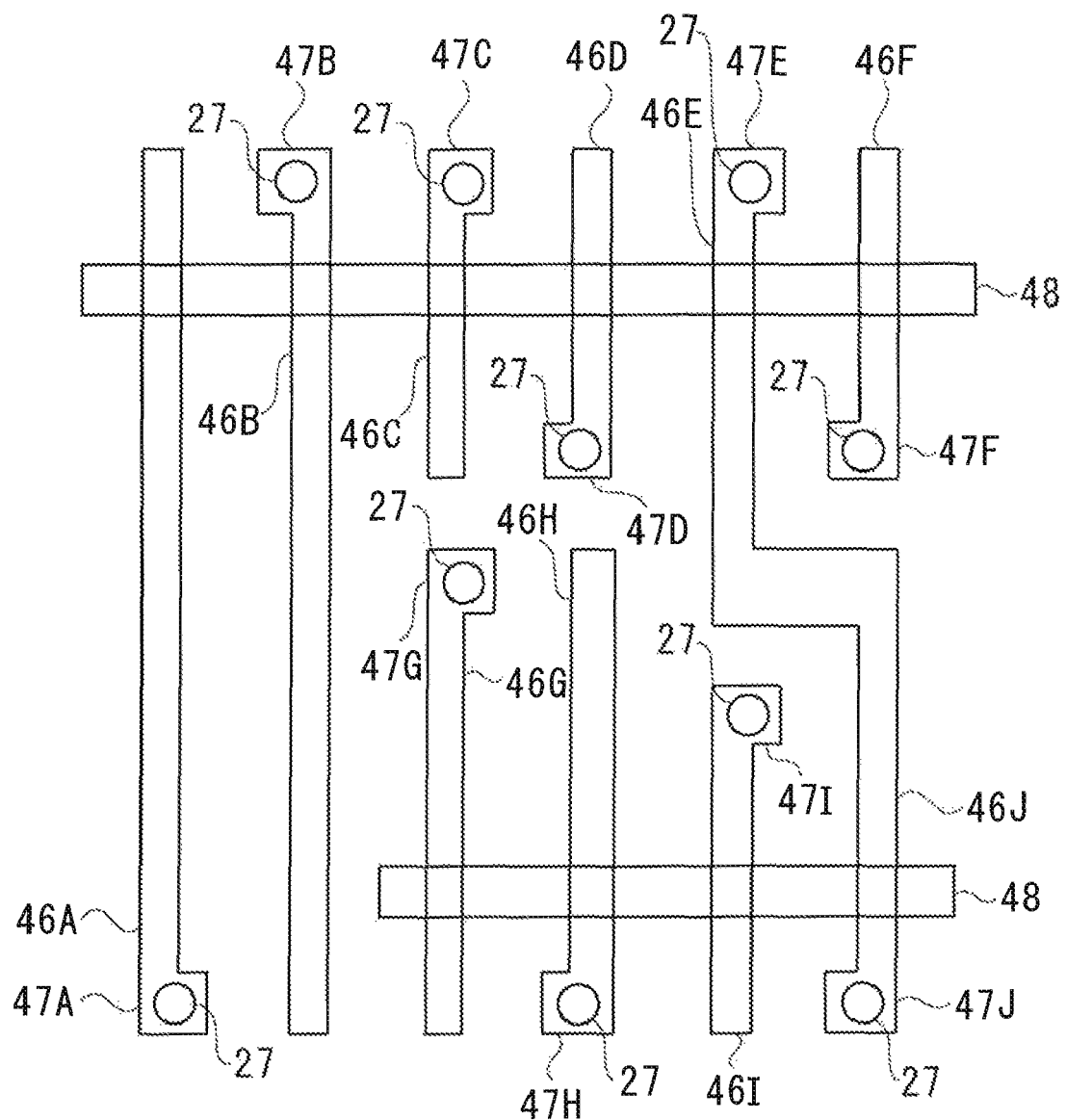
FIG. 32 is a layout view illustrating the semiconductor device.

FIG. 32 illustrates a layout of the semiconductor device according to the second embodiment. In the layout of the semiconductor device which is illustrated in FIG. 32, gate electrodes 46A to 46J, contact regions 47A to 47J, and active regions 48 serving as sources or drains are designed. On the contact regions 47A to 47J, the contacts 27 are designed. The gate electrodes 46A to 46J have a rectangular shape and the contact regions 47A to 47J have a square shape. The shape of the gate electrodes 46A to 46J and the shape of the contact regions 47A to 47J illustrated in FIG. 32 are examples and thus may be other shapes. As illustrated in FIG. 32, the gate electrode 46A and the contact region 47A are provided adjacent to each other such that a side of the gate electrode 46A and a side of the contact region 47A are on the same linear line. When the gate electrode 46A and the contact region 47A are provided adjacent to each other, the gate electrode 46A and the contact region 47A have a hook shape. The same is expected for the gate electrodes 46B to 46J and the contact regions 47B to 47J.

Figure 33:
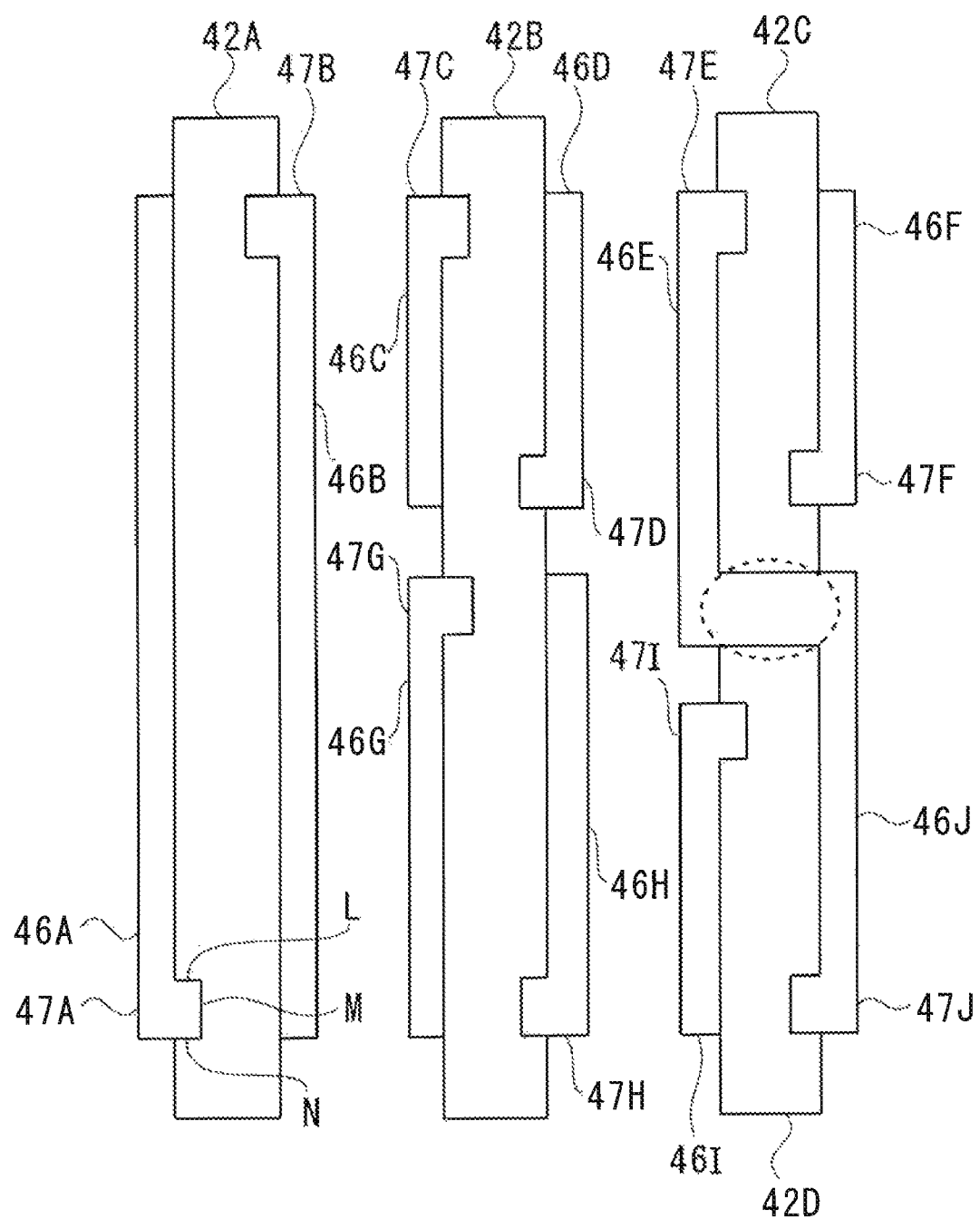
FIG. 33 is a layout view illustrating the gate electrodes, the contact regions, and hard mask patterns.

FIG. 33 illustrates a layout in a case where the shapes of the assist patterns 42A to 42D are designed based on the shape of the gate electrodes 46A to 46J and the shape of the contact regions 47A to 47J. As illustrated in FIG. 33, the shape of the assist pattern 42A is designed such that the assist pattern 42A is in contact with three sides (sides L, M, and N) of a projected portion of the contact region 47A. The same is expected for the assist patterns 42B to 42D.

When the semiconductor device is to be manufactured, side surfaces of the assist patterns 42 formed on the polysilicon film 40 are desirably linear. That is, when the side surfaces of the assist patterns 42 are linear in the case where the semiconductor device is to be manufactured, the hard mask patterns 44 formed on the side surfaces of the assist patterns 42 are more easily formed into a linear shape. When the linear portions of the hard mask patterns 44 are long, the linear portions of the gate electrodes 46 are long, and hence it is advantageous to the linearity of the gate electrodes 46. Therefore, in the layout illustrated in FIG. 33, the shapes of the assist patterns 42A to 42D are designed such that the side surfaces of the assist patterns 42A to 42D are as linear as possible.

When the semiconductor device is to be manufactured, the hard mask patterns 44 are formed on the side surfaces of the assist patterns 42 at a predetermined thickness. As described above, when the hard mask patterns 44 are to be formed on the side surfaces of the assist patterns 42, the metal film 43 is formed by evaporation on the upper surfaces and the side surfaces of the assist patterns 42. When a distance between the adjacent assist patterns 42 is sufficiently large, the metal film 43 may be formed by evaporation on each of the side surfaces of the adjacent assist patterns 42. That is, when the distance between the adjacent assist patterns 42 is sufficiently large, the metal film 43 is separately formed by evaporation on each of the side surfaces of the adjacent assist patterns 42.

On the other hand, when the distance between the adjacent assist patterns 42 is not sufficiently large, in other words, when the distance between the adjacent assist patterns 42 is equal to or smaller than a predetermined value, the metal films 43 formed by evaporation on the side surfaces of the adjacent assist patterns 42 are connected to each other. Therefore, the hard mask patterns 44 may be formed based on the nature in which the metal films 43 formed by evaporation on the side surfaces of the adjacent assist patterns 42 are connected to each other.

When the distance between the adjacent assist patterns 42 is equal to or smaller than the predetermined value, for example, the hard mask pattern 44 that forms a thick wire line indicated by an area surrounded by a broken line of FIG. 33 may be formed. When the distance between the adjacent assist patterns 42 is equal to or smaller than the predetermined value, for example, the hard mask pattern 44 that forms the contact region 47 in any position of the gate electrode 46 may be formed.

When the distance between the adjacent assist patterns 42 is gradually shortened, there is a variation point in which the metal films 43 formed by evaporation on the side surfaces of the adjacent assist patterns 42 are connected to each other, with respect to the predetermined distance. A width of the hard mask pattern 44 obtained by connecting to each other the metal films 43 formed by evaporation on the side surfaces of the adjacent assist patterns 42 may be defined as follows.

For example, assume that the width of the hard mask pattern 44 formed in the case where the distance between the adjacent assist patterns 42 is sufficiently large is expressed by "A" (nm). In this case, 2 A (nm) which is two times "A" theoretically corresponds to the width of the hard mask pattern 44 formed by connection. The hard mask pattern 44 formed by connection is the hard mask pattern 44 obtained by connecting to each other the metal films 43 formed by evaporation on the side surfaces of the adjacent assist patterns 42. The adjacent assist patterns 42 are formed on the polysilicon film 40 such that the distance between the adjacent assist patterns 42 is a distance two times a lateral width of the hard mask pattern 44. Therefore, the width of the hard mask pattern 44 formed by connection may be set to two times the width of the hard mask pattern 44 which is not formed by connection.

The adjacent assist patterns 42 may be formed on the polysilicon film 40 such that the distance between the adjacent assist patterns 42 is a distance equal to or smaller than two times the lateral width of the hardmask pattern 44. It is likely to produce voids or the like during film formation depending on film formation conditions, and hence the width of the hard mask pattern 44 formed by connection is desirably approximately 1.5 A to 1.6 A (nm). In a case where such conditions are taken into account to form the hard mask pattern 44 formed by connection, when the width (gate length) of the gate electrode 46 is expressed by "A" (nm), a wire line width is approximately 1.5 A to 1.6 A (nm).

Figure 34:
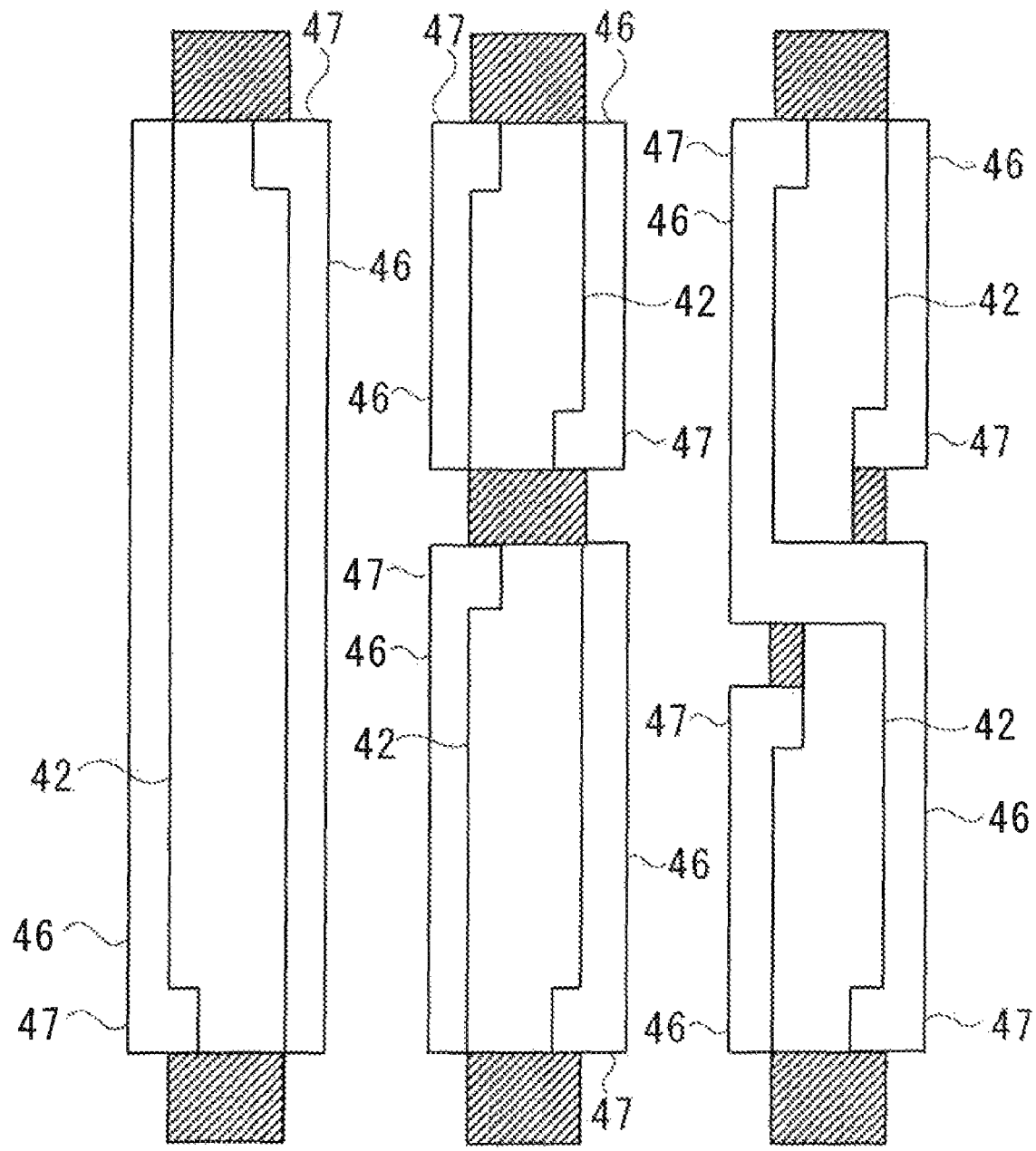
FIG. 34 is a layout view illustrating the gate electrodes, the contact regions, and the hard mask patterns.

An example in a case where the assist patterns 42 are formed on the polysilicon film 40 based on the shapes of the assist patterns 42 illustrated in FIG. 34 is described with reference to FIGS. 34 to 36. FIG. 34 illustrates a layout including the gate electrodes 46A to 46J, the contact regions 47A to 47J, and the assist patterns 42A to 42D. When the shapes of the assist patterns 42 illustrated in FIG. 34 is compared with the shapes of the assist patterns 42 illustrated in FIG. 33, regions indicated by oblique lines are not designed.

Figure 35:
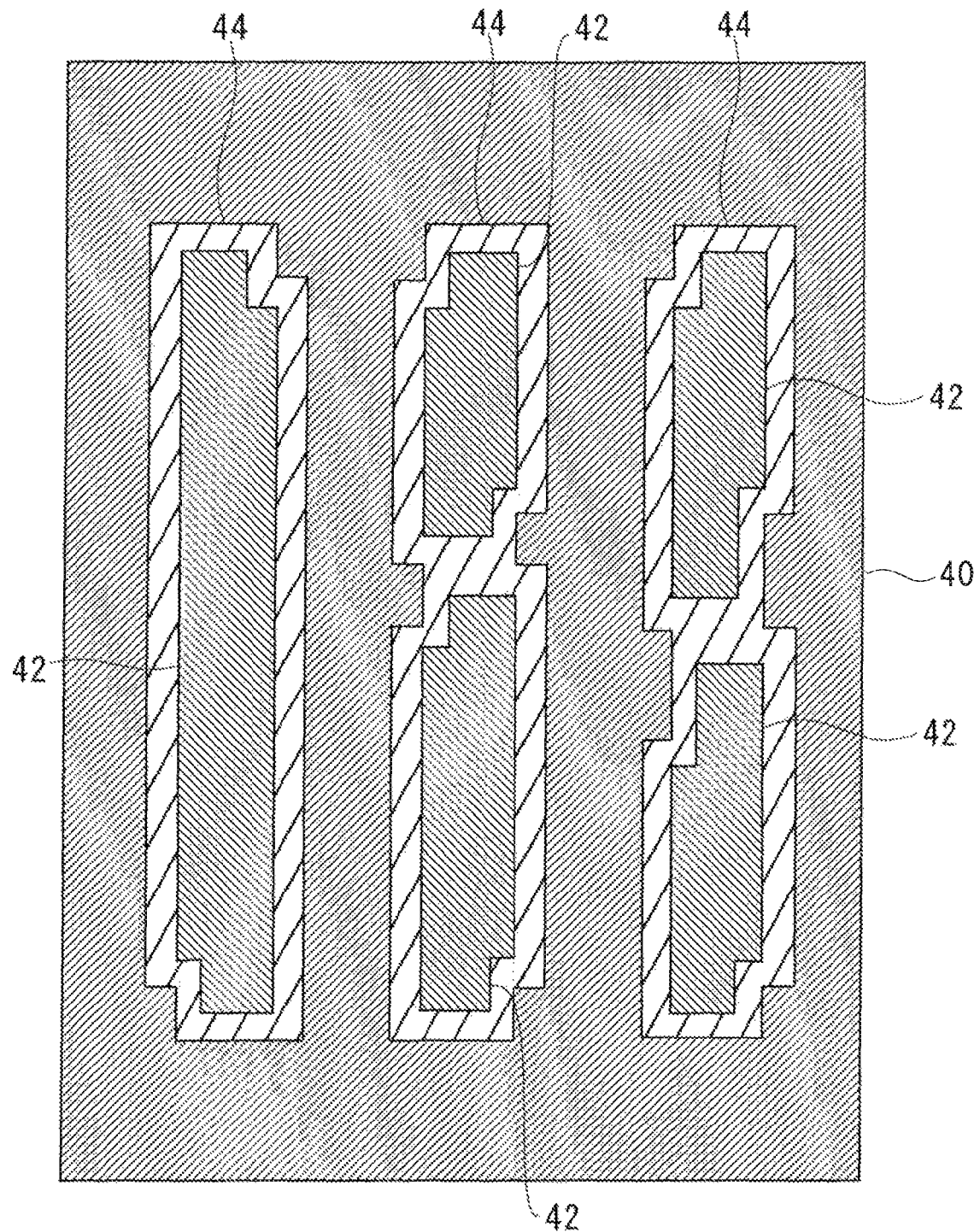
FIG. 35 is a top view illustrating the semiconductor device according to the second embodiment.

FIG. 35 is a top view illustrating the semiconductor device in the case where the assist patterns 42 are formed on the polysilicon film 40 based on the shapes of the assist patterns 42 illustrated in FIG. 34 and the hard mask patterns 44 are formed on the side surfaces of the assist patterns 42.

When the assist patterns 42 illustrated in FIG. 35 are removed and the hard mask patterns 44 are partially removed using the resist pattern 45, the miniaturized hard mask patterns 44 may be formed. When the polysilicon film 40 is etched using the miniaturized hard mask patterns 44 as masks, the gate electrodes 46 and the contact regions 47 which are miniaturized may be formed above the semiconductor substrate 1 as illustrated in FIG. 36.

Figure 36:
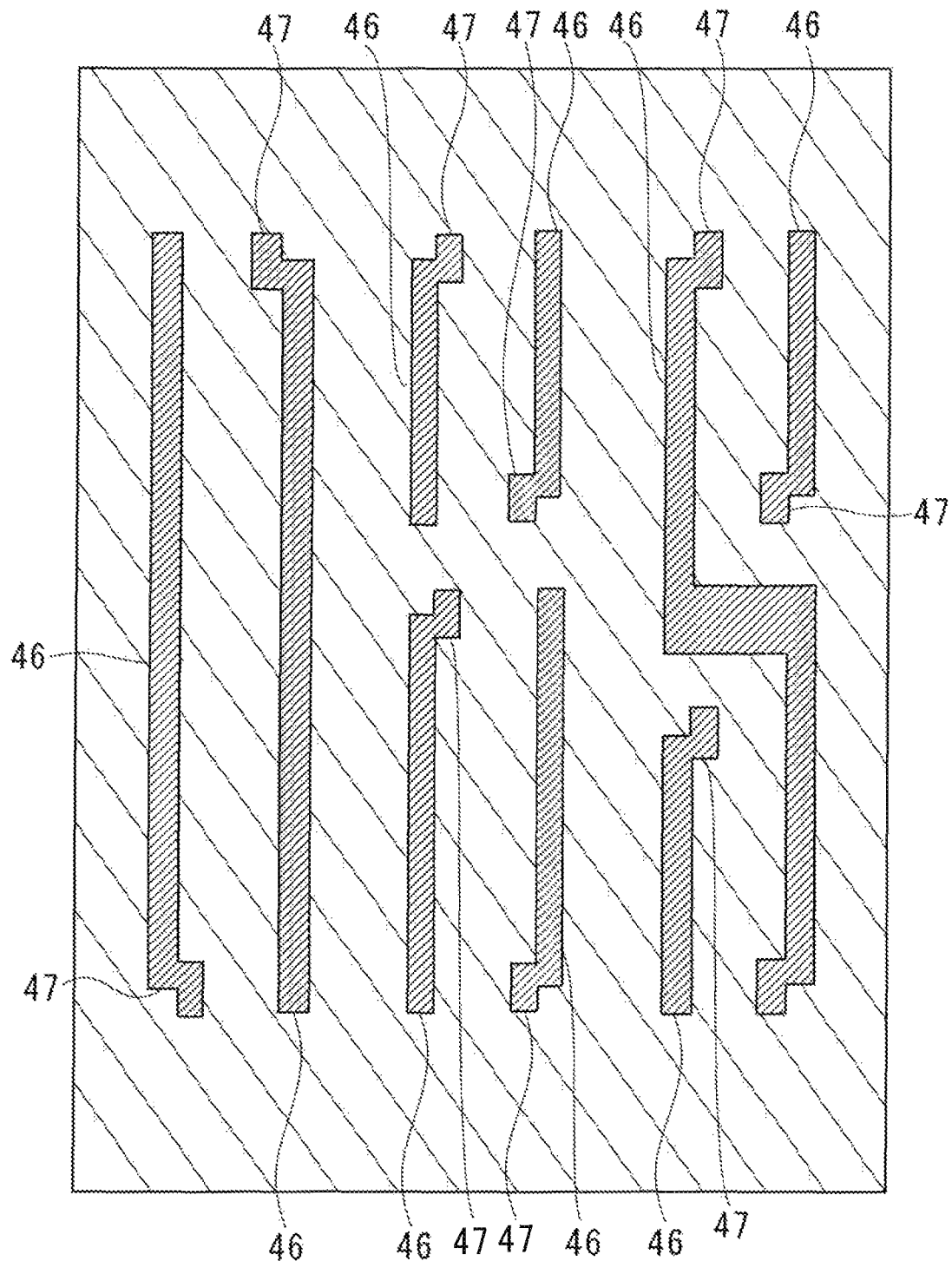
FIG. 36 is a top view illustrating the semiconductor device according to the second embodiment.

As illustrated in FIG. 36, parts of the contact regions 47 are chipped off. Therefore, when the contact 27 is formed on each of the contact regions 47, a part of the bottom surface of the contact 27 is not in contact with each of the contact regions 47. In this case, a contact area of the bottom surface of the contact 27 is approximately 75%. That is, a loss of the contact area of the bottom surface of the contact 27 is approximately 25%. When the assist patterns 42 are formed also in the regions indicated by the oblique lines illustrated in FIG. 34, the loss of the contact area of the bottom surface of the contact 27 may be suppressed. That is, when the shapes of the assist patterns 42 are designed to be more projected in the longitudinal direction as compared with the shapes of the gate electrodes 46 and the shapes of the contact regions 47 as illustrated in FIG. 33, the loss of the contact area of the bottom surface of the contact 27 may be suppressed.

Figure 37:
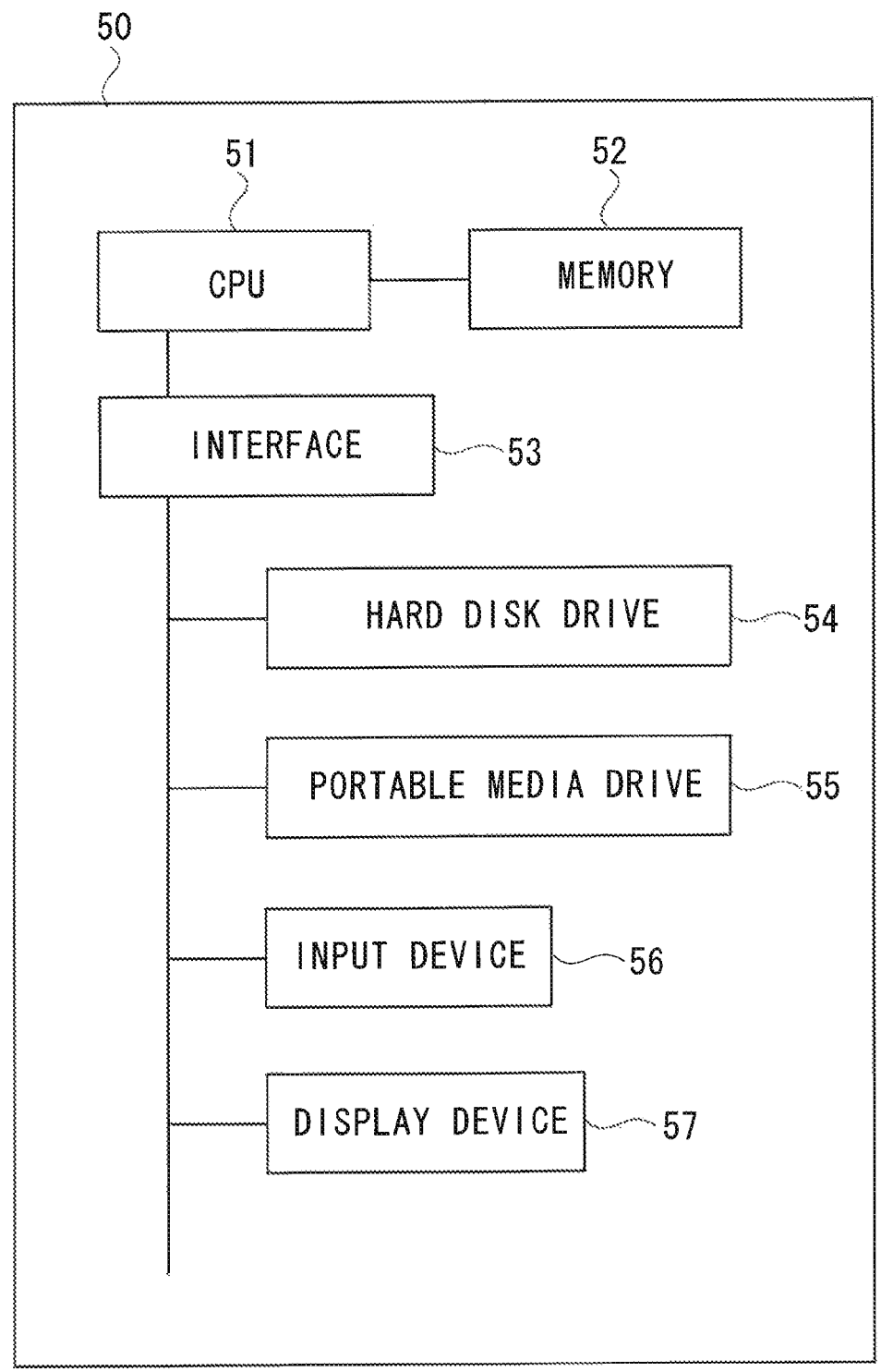
FIG. 37 is a structural diagram illustrating a design support apparatus.

Next, a method of creating shape data of the assist patterns 42 is described. FIG. 37 is a structural diagram illustrating a design support apparatus 50 used to create the shape data of the assist patterns 42. The design support apparatus 50 includes a central processing unit (CPU) 51 that executes computer programs to control the design support apparatus 50 and a memory 52 that stores the computer programs executed by the CPU 51 and data processed by the CPU 51. As illustrated in FIG. 37, the design support apparatus 50 includes an interface 53 which connects the CPU 51 to various devices, a hard disk drive 54, a portable media drive 55, an input device 56, and a display device 57.

The memory 52 stores the computer programs executed by the CPU 51 and the data processed by the CPU 51. The memory 52 includes, for example, a volatile random access memory (RAM) and a nonvolatile read only memory (ROM). The interface 53 may be any one of a serial interface such as an universal serial bus (USB) and a parallel interface such as a peripheral component interconnect (PCI). The CPU 51 is connected to various devices through the interface 53. The CPU 51 may be connected to various devices through different interfaces. A plurality of interfaces 53 may be bridge-connected to one another.

The hard disk drive 54 stores programs loaded to the memory 52. The hard disk drive 54 stores data processed by the CPU 51. The portable media drive 55 is a drive for, for example, a compact disc (CD), a digital versatile disk (DVD), an HD-DVD, or a blue-ray disk. The portable media drive 55 may be an input and output device for a card medium including a nonvolatile memory such as a flash memory. A medium driven by the portable media drive 55 stores, for example, computer programs installed in the hard disk drive 54 and input data. The input device 56 is, for example, a keyboard, a mouse, a pointing device, or a wireless remote controller.

The display device 57 displays data processed by the CPU 51 and data stored in the memory 52. The display device 57 is, for example, a liquid crystal display device, a plasma display panel, a cathode ray tube (CRT), or an electroluminescence panel.

Figure 38:
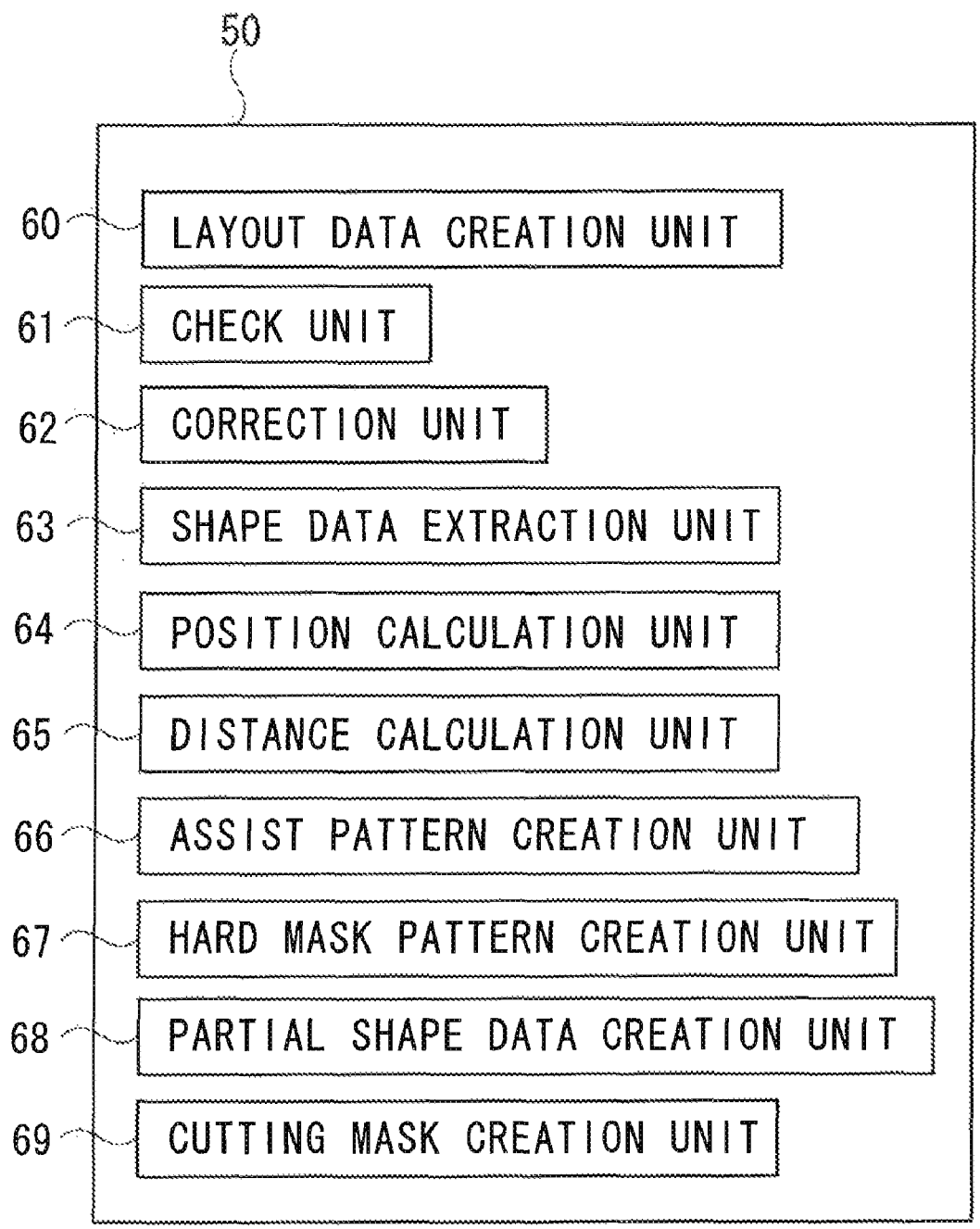
FIG. 38 is a functional block diagram illustrating the design support apparatus.

FIG. 38 is a functional block diagram illustrating the design support apparatus 50. The respective functional units illustrated in FIG. 38 may be realized by a computer including the CPU 51 and the memory 52, the respective devices, and the programs executed by the computer.

Figure 39:
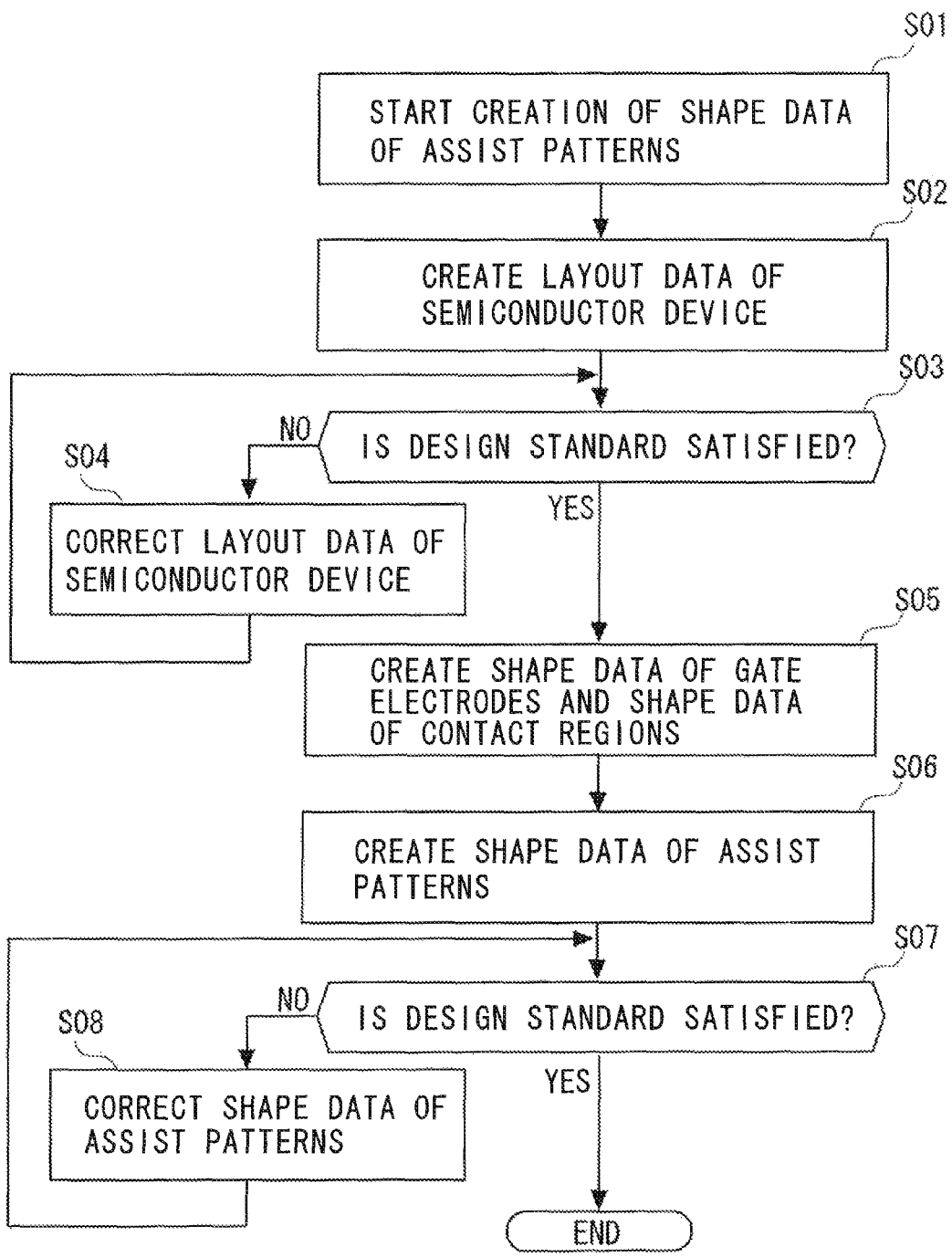
FIG. 39 is a flow chart illustrating a method of creating shape data of assist patterns.

FIG. 39 is a flow chart illustrating the method of creating the shape data of the assist patterns 42 which is executed by the design support apparatus 50. In Step S01 illustrated in FIG. 39, the design support apparatus 50 starts the creation of the shape data of the assist patterns 42. For example, the design support apparatus 50 may start the creation of the shape data of the assist patterns 42 upon receiving an instruction for the creation of the shape data of the assist patterns 42 from the input device 56.

In Step S02 illustrated in FIG. 39, a layout data creation unit 60 (corresponding to layout unit) creates layout data of the semiconductor device. For example, the layout data creation unit 60 creates the layout data of the semiconductor device which is illustrated in FIG. 32.

Next, in Step S03 illustrated in FIG. 39, a check unit 61 performs design rule check (DRC) on the layout data of the semiconductor device which is created by the layout data creation unit 60. The design rule check in this case verifies whether or not the layout data of the semiconductor device satisfies a design standard (design rule).

When the layout data of the semiconductor device does not satisfy the design standard (NO in Step S03 illustrated in FIG. 39), processing goes to Step S04 illustrated in FIG. 39. In Step S04 illustrated in FIG. 39, a correction unit 62 corrects the layout data of the semiconductor device. In Step S03 illustrated in FIG. 39, the corrected layout data of the semiconductor device is subjected to the design rule check again by the check unit 61.

Figure 40:
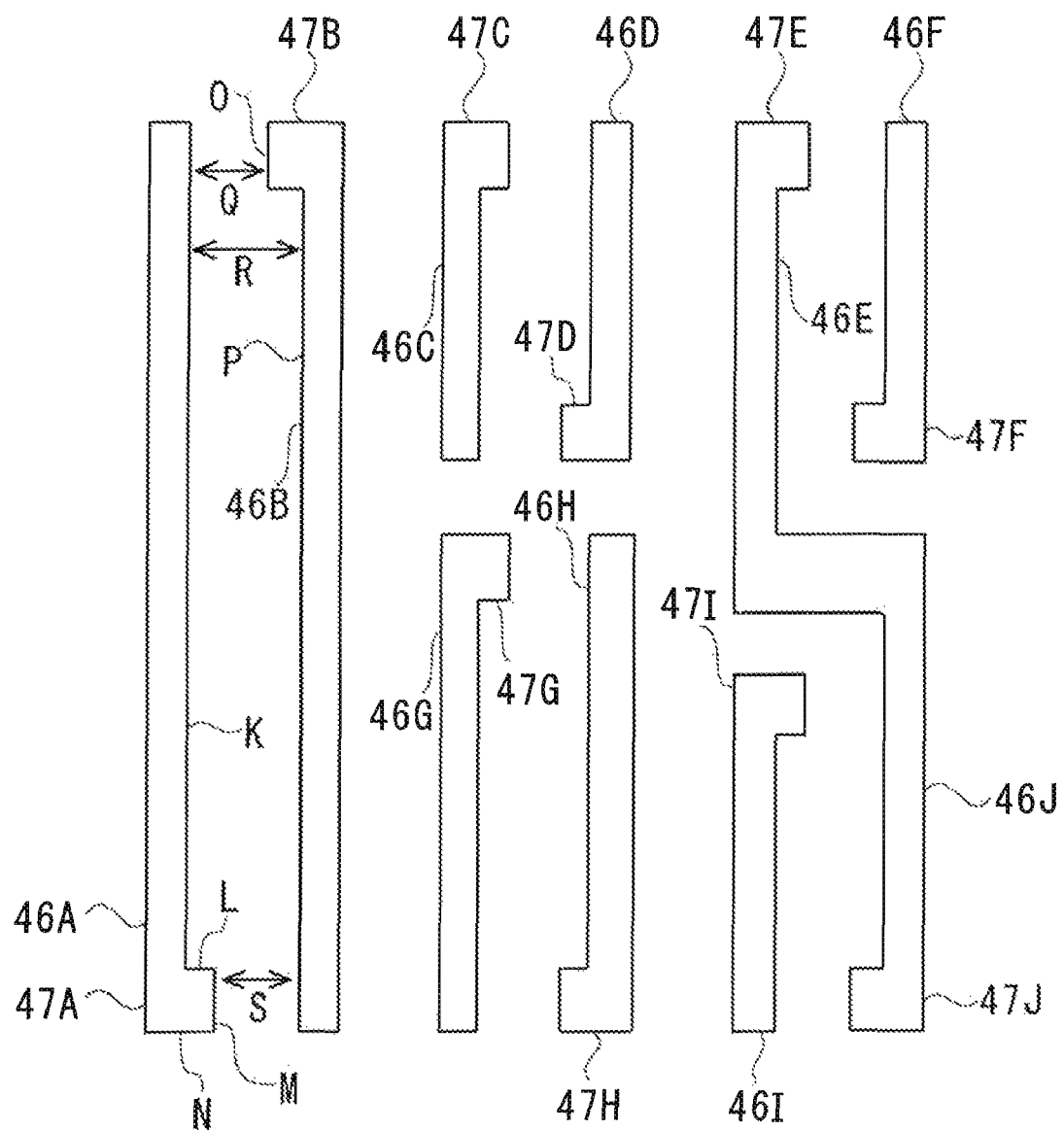
FIG. 40 illustrates shape data of the gate electrodes and shape data of the contact regions.

On the other hand, when the layout data of the semiconductor device satisfies the design standard (YES in Step S03 illustrated in FIG. 39), processing goes to Step S05 illustrated in FIG. 39. In Step S05 illustrated in FIG. 39, a shape data extraction unit 63 (corresponding to extraction unit) extracts the gate electrodes 46 and the contact regions 47 from the layout data of the semiconductor device and creates the shape data of the gate electrodes 46 and the shape data of the contact regions 47. When the plurality of gate electrodes 46 and the plurality of contact regions 47 are included in the layout data of the semiconductor device, the shape data extraction unit 63 extracts the plurality of gate electrodes 46 and the plurality of contact regions 47 from the layout data of the semiconductor device. For example, the shape data extraction unit 63 extracts the gate electrodes 46A to 46J and the contact regions 47A to 47J from the layout data of the semiconductor device which is illustrated in FIG. 32 and creates the shape data of the gate electrodes 46A to 46J and the shape data of the contact regions 47A to 47J which are illustrated in FIG. 40. Hereinafter the shape data of the gate electrodes 46 and the shape data of the contact regions 47 are referred to as design intent data.

In Step S06 illustrated in FIG. 39, a position calculation unit 64 determines, as the contact regions 47 which are in contact with the assist patterns 42 to be formed, the two contact regions 47 in which the projected portions of the contact regions 47 are faced to each other. For example, the position calculation unit 64 determines the contact regions 47A and 47B based on the layout data illustrated in FIG. 40. The position calculation unit 64 determines the contact regions 47C to 47J in the same manner.

In Step S06 illustrated in FIG. 39, the position calculation unit 64 calculates a position of a side of the gate electrode 46 adjacent to one of the determined two contact regions 47. In this case, the position calculation unit 64 calculates the position of the side of the gate electrode 46 which is different in level from a side of the contact region 47. For example, the position calculation unit 64 calculates a position of a side K of the gate electrode 46A in the layout data illustrated in FIG. 40.

In Step S06 illustrated in FIG. 39, the position calculation unit 64 calculates a position of a side of one of the determined two contact regions 47. In this case, the position calculation unit 64 calculates the position of the side of the contact region 47 which is different in level from the side of the gate electrode 46. For example, the position calculation unit 64 calculates a position of a side M of the contact region 47A in the layout data illustrated in FIG. 40.

In Step S06 illustrated in FIG. 39, the position calculation unit 64 calculates a position of a side of the other of the determined two contact regions 47. In this case, the position calculation unit 64 calculates the position of the side of the contact region 47 which is different in level from the side of the gate electrode 46. For example, the position calculation unit 64 calculates a position of a side O of the contact region 47B in the layout data illustrated in FIG. 40.

In Step S06 illustrated in FIG. 39, the position calculation unit 64 calculates a position of a side of the gate electrode 46 adjacent to the other of the determined two contact regions 47. In this case, the position calculation unit 64 calculates the position of the side of the gate electrode 46 which is different in level from the side of the contact region 47. For example, the position calculation unit 64 calculates a position of a side P of the gate electrode 46B in the layout data illustrated in FIG. 40.

In Step S06 illustrated in FIG. 39, the position calculation unit 64 calculates a distance between the position of the side of the gate electrode 46 adjacent to one of the determined two contact regions 47 and the position of the side of the other of the determined two contact regions 47. For example, the position calculation unit 64 calculates a distance Q between the position of the side K of the gate electrode 46A and the position of the side O of the contact region 47B in the layout data illustrated in FIG. 40.

In Step S06 illustrated in FIG. 39, the distance calculation unit 65 calculates a distance between the position of the side of the gate electrode 46 adjacent to one of the determined two contact regions 47 and the position of the side of the gate electrode 46 adjacent to the other of the determined two contact regions 47. For example, the distance calculation unit 65 calculates a distance R between the position of the side K of the gate electrode 46A and the position of the side P of the gate electrode 46B in the layout data illustrated in FIG. 40.

In Step S06 illustrated in FIG. 39, the distance calculation unit 65 calculates a distance between the position of the side of one of the determined two contact regions 47 and the position of the side of the gate electrode 46 adjacent to the other of the target two contact regions 47. For example, the distance calculation unit 65 calculates a distance S between the position of the side M of the contact region 47A and the position of the side P of the gate electrode 46B in the layout data illustrated in FIG. 40.

In Step S06 illustrated in FIG. 39, an assist pattern creation unit 66 (corresponding to first pattern creation unit) creates the shape data of the assist patterns 42 based on the calculated distances. In this case, the assist pattern creation unit 66 creates the shape data of the assist pattern 42 such that the assist pattern 42 is in contact with three sides of the projected portion of the contact region 47. The assist pattern 42 is in contact with the three sides of the projected portion of the contact region 47, and hence the assist pattern 42 is further projected as compared with an end portion of the gate electrode 46 and an end portion of the contact region 47. For example, the assist pattern creation unit 66 creates the shape data of the assist patterns 42, the shape data of the gate electrodes 46, and the shape data of the contact regions 47, which are illustrated in FIG. 33. FIG. 33 illustrates the shape data of the assist patterns 42, the shape data of the gate electrodes 46, and the shape data of the contact regions 47, but the assist pattern creation unit 66 may create only the shape data of the assist patterns 42.

In Step S07 illustrated in FIG. 39, the check unit 61 performs the design rule check on the shape data of the assist patterns 42 which is created by the assist pattern creation unit 66. The design rule check in this case verifies whether or not the shape data of the assist patterns 42 satisfies the design standard (design rule).

When the shape data of the assist patterns 42 does not satisfy the design standard (NO in Step S07 illustrated in FIG. 39), processing goes to Step S08 illustrated in FIG. 39. In Step S08 illustrated in FIG. 39, the correction unit 62 corrects the shape data of the assist patterns 42. In Step S07 illustrated in FIG. 39, the corrected shape data of the assist patterns 42 is subjected to the design rule check again by the check unit 61.

On the other hand, when the shape data of the assist patterns 42 satisfies the design standard (YES in Step S07 illustrated in FIG. 39), the design support apparatus 50 completes the creation of the shape data of the assist patterns 42.

Figure 41:
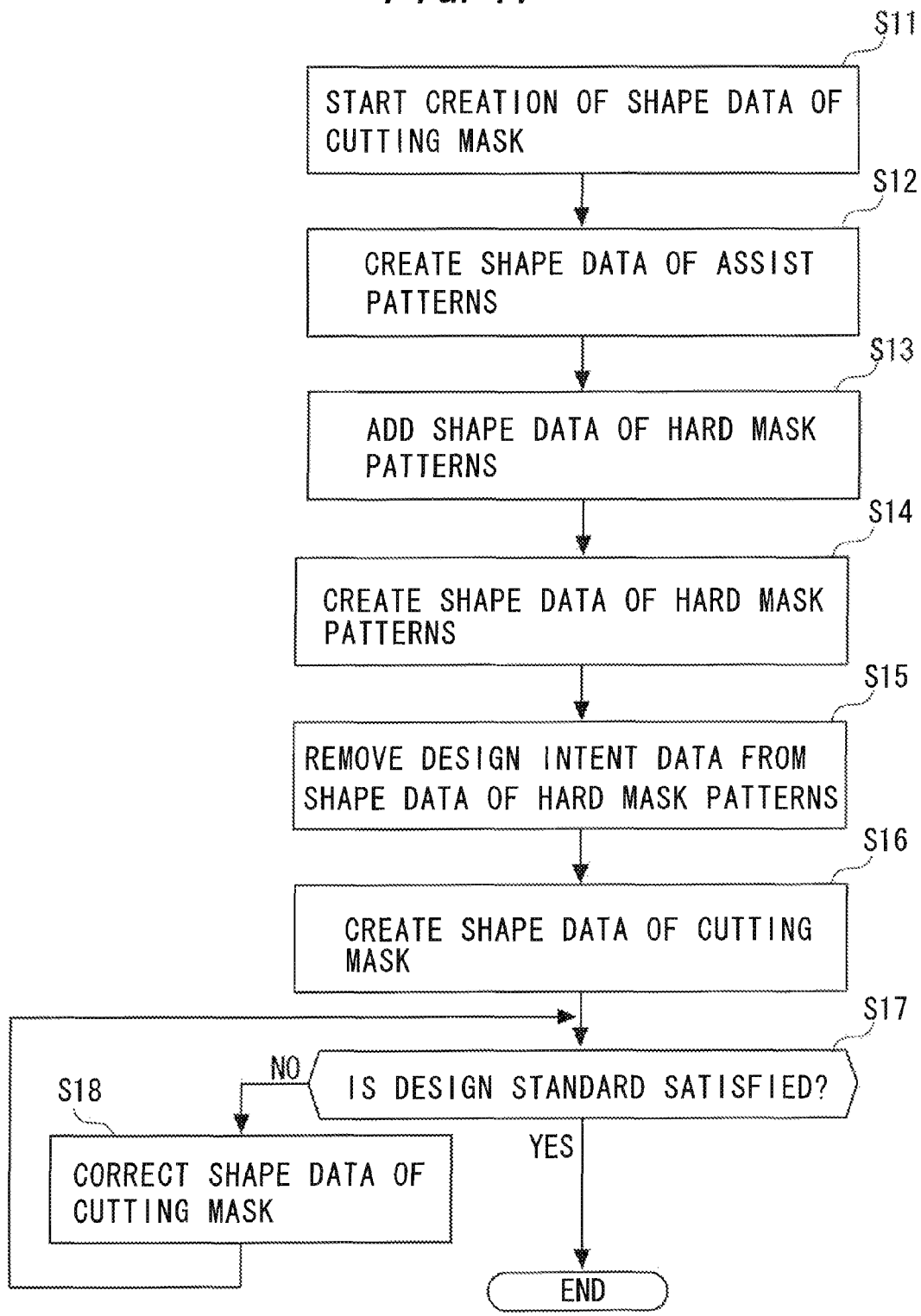
FIG. 41 is a flow chart illustrating a method of creating shape data of a cutting mask.

FIG. 41 is a flow chart illustrating a method of creating shape data of a cutting mask 70 which is executed by the design support apparatus 50. In Step S11 illustrated in FIG. 41, the design support apparatus 50 starts the creation of the shape data of the cutting mask 70. For example, the design support apparatus 50 may start the creation of the shape data of the cutting mask 70 upon receiving an instruction for the creation of the shape data of the cutting mask 70 from the input device 56.

In Step S12 illustrated in FIG. 41, the design support apparatus 50 creates the shape data of the assist patterns 42. In this case, the design support apparatus 50 creates the shape data of the assist patterns 42 along the flow for the method of creating the shape data of the assist patterns 42 as illustrated in FIG. 39.

Figure 42:
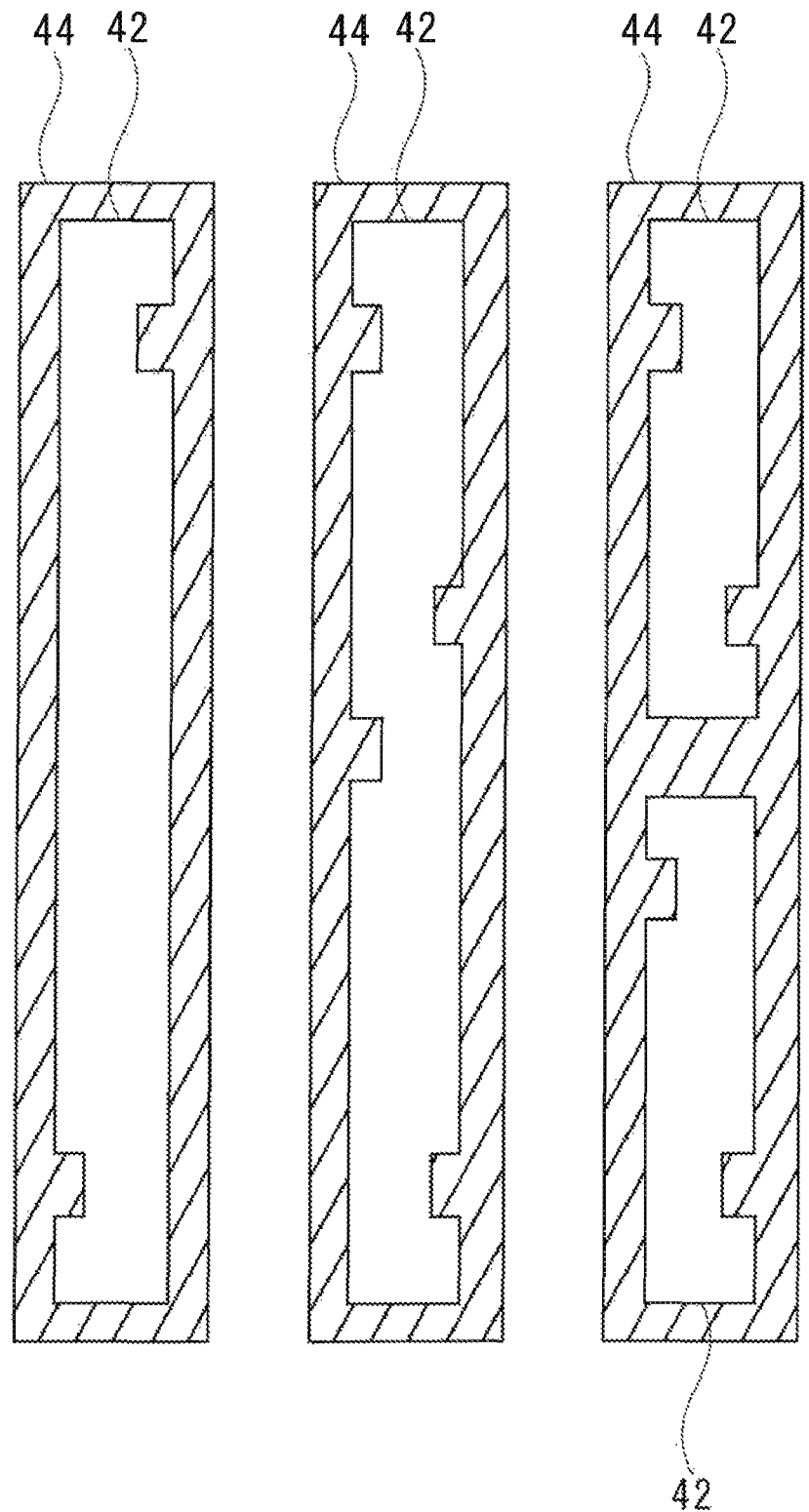
FIG. 42 illustrates design data.

In Step S13 illustrated in FIG. 41, a hard mask pattern creation unit 67 (corresponding to second pattern creation unit) adds the shape data of the hard mask patterns 44 to the shape data of the assist patterns 42. In this case, the hard mask pattern creation unit 67 adds the shape data of the hard mask patterns 44 to the shape data of the assist patterns 42 based on the shapes and sizes of the gate electrodes 46 and the contact regions 47 and the type and film formation condition of the metal film 43. When the shape data of the hard mask patterns 44 is to be added to the shape data of the assist patterns 42, all parameters including the shapes and sizes of the gate electrodes 46 and the contact regions 47 and the type and film formation condition of the metal film 43 are not essential. The hard mask pattern creation unit 67 may suitably select the parameters including the shapes and sizes of the gate electrodes 46 and the contact regions 47 and the type and film formation condition of the metal film 43 and add the shape data of the hard mask patterns 44 to the shape data of the assist patterns 42. FIG. 42 illustrates design data in the case where the shape data of the hard mask patterns 44 is added to the shape data of the assist patterns 42.

In Step S14 illustrated in FIG. 41, the hardmask pattern creation unit 67 removes the shape data of the assist patterns 42 from the design data created in Step S13 illustrated in FIG. 41 to create the shape data of the hard mask patterns 44. That is, the hard mask pattern creation unit 67 performs a NOT operation between the design data created in Step S13 illustrated in FIG. 41 and the shape data of the assist patterns 42, to create the shape data of the hard mask patterns 44.

In Step S15 illustrated in FIG. 41, a partial shape data creation unit 68 (corresponding to third pattern creation unit) removes, from the shape data of the hard mask patterns 44 created in Step S14 illustrated in FIG. 41, the design intent data created in Step S05 illustrated in FIG. 39. That is, the partial shape data creation unit 68 performs a NOT operation between the shape data of the hard mask patterns 44 created in Step S14 illustrated in FIG. 41 and the design intent data created in Step S05 illustrated in FIG. 39. FIG. 43 illustrates the design data created by removing, from the shape data of the hard mask patterns 44 created in Step S14 illustrated in FIG. 41, the design intent data created in Step S05 illustrated in FIG. 39. The design data is partial shape data of the hard mask patterns 44 which is created by removing the design intent data from the shape data of the hard mask patterns 44.

In Step S16 illustrated in FIG. 41, a cutting mask creation unit 69 (corresponding to mask data creation unit) creates the shape data of the cutting mask 70. In this case, the cutting mask creation unit 69 performs the coupling of the cutting masks 70. In FIG. 43, a distance between the hard mask pattern 44A and the hard mask pattern 44B is short. Therefore, when the cutting mask 70 for cutting (removing) the hard mask pattern 44A and the cutting mask 70 for cutting (removing) the hard mask pattern 44B are created, the cutting masks 70 are overlapped with each other.

Thus, the cutting mask 70 for cutting (removing) the hard mask pattern 44A and the cutting mask 70 for cutting (removing) the hard mask pattern 44B are coupled to each other to prevent the cutting masks 70 from being overlapped with each other. The same may be said for the hard mask pattern 44C illustrated in FIG. 43. In this case, the cutting mask creation unit 69 performs the coupling of the cutting masks 70 in order to collectively cut (remove) the hard mask patterns 44A, 44B, and 44C.

Figure 44:
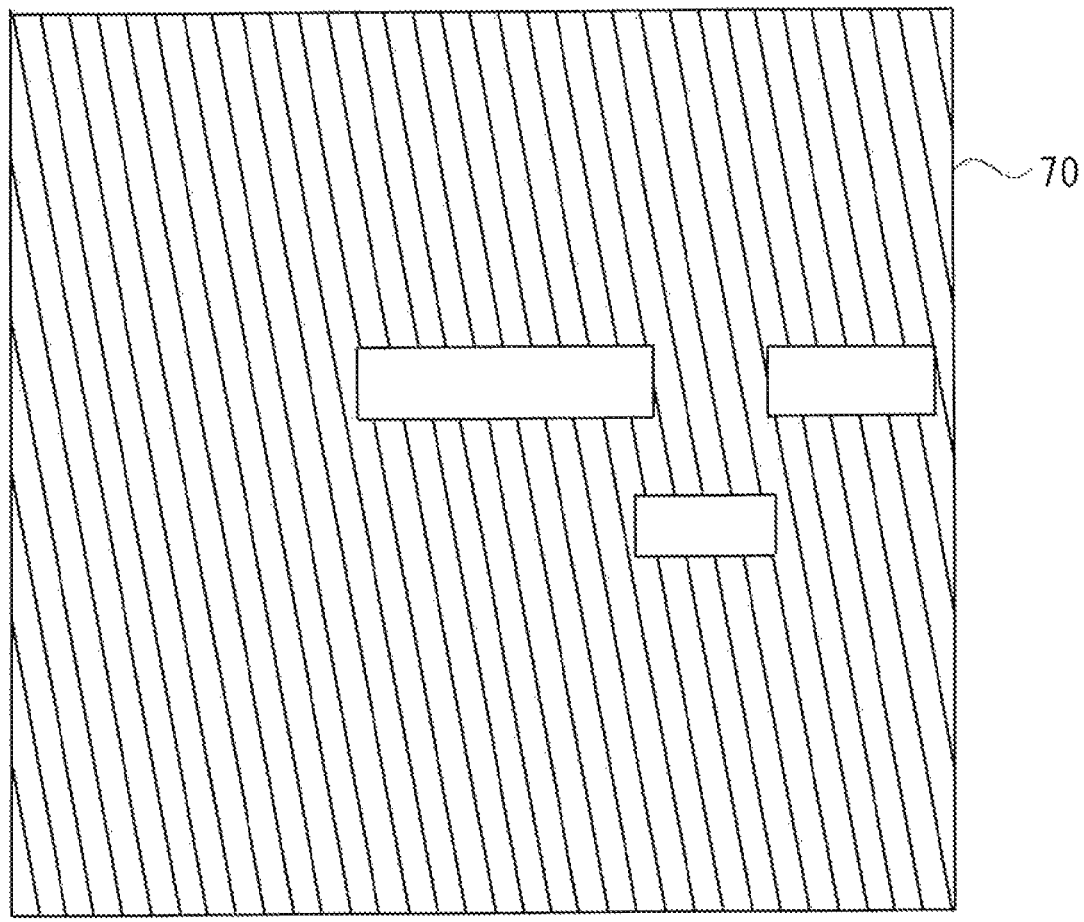
FIG. 44 illustrates shape data of the cutting mask.

FIG. 44 illustrates the shape data of the cutting mask 70 created by the cutting mask creation unit 69. As illustrated in FIG. 44, in order to collectively cut (remove) the hard mask patterns 44A, 44B, and 44C illustrated in FIG. 43, the coupling of the cutting masks 70 is performed to create the shape data of the cutting mask 70.

In Step S16 illustrated in FIG. 41, for example, when the distance between the adjacent hard mask patterns 44 is smaller than 45 nm, the cutting mask creation unit 69 may perform the coupling of the cutting masks 70.

When the coupling of the cutting masks 70 is performed as described above, a photo mask (reticle) for cutting (removing) the hard mask patterns 44 may be created as a single mask.

Next, in Step S17 illustrated in FIG. 41, the check unit 61 performs the design rule check on the shape data of the cutting mask 70 created by the cutting mask creation unit 69. The design rule check in this case verifies whether or not the shape data of the cutting mask 70 satisfies the design standard (design rule). That is, the check unit 61 verifies whether or not there is a problem with the shape of the cutting mask 70 manufactured based on the shape data of the cutting mask 70.

When the shape data of the cutting mask 70 does not satisfy the design standard, processing goes to Step S18 illustrated in FIG. 41. In Step S18 illustrated in FIG. 41, the correction unit 62 corrects the shape data of the cutting mask 70. For example, the correction unit 62 changes merge parameters for performing the coupling of the cutting masks 70 and the like, to correct the shape data of the cutting mask 70. The merge parameters include sizes of the cutting masks 70 and a coupling position between the cutting masks 70. In Step S17 illustrated in FIG. 41, the corrected shape data of the cutting mask 70 is subjected to the design rule check again by the check unit 61.

On the other hand, when the shape data of the cutting mask 70 satisfies the design standard, the design support apparatus 50 completes the creation of the shape data of the cutting mask 70.

According to the embodiments, the contact region may be prevented from being chipped off. In the first embodiment and the second embodiment, the examples of the complementary metal oxide semiconductor (CMOS) manufacturing method have been described. However, the embodiments are not limited to the CMOS manufacturing method. The semiconductor device and manufacturing method therefor according to each of the first embodiment and the second embodiment may also be applied to a p-type (p-channel) MOS or n-type (n-channel) MOS manufacturing method. The semiconductor device and manufacturing method therefor according to each of the first embodiment and the second embodiment encompass a semiconductor device for multilayer wiring and manufacturing method therefor.

Modified Example

The method of forming the hard mask patterns 44 described in the second embodiment may be applied to form CMP dummy patterns 80. The CMP dummy patterns 80 are patterns formed above the semiconductor substrate 1 to improve the degree of planarization in a CMP process. Hereinafter, a modified example of the semiconductor device manufacturing method according to the second embodiment is described with reference to FIG. 45.

Figure 45:
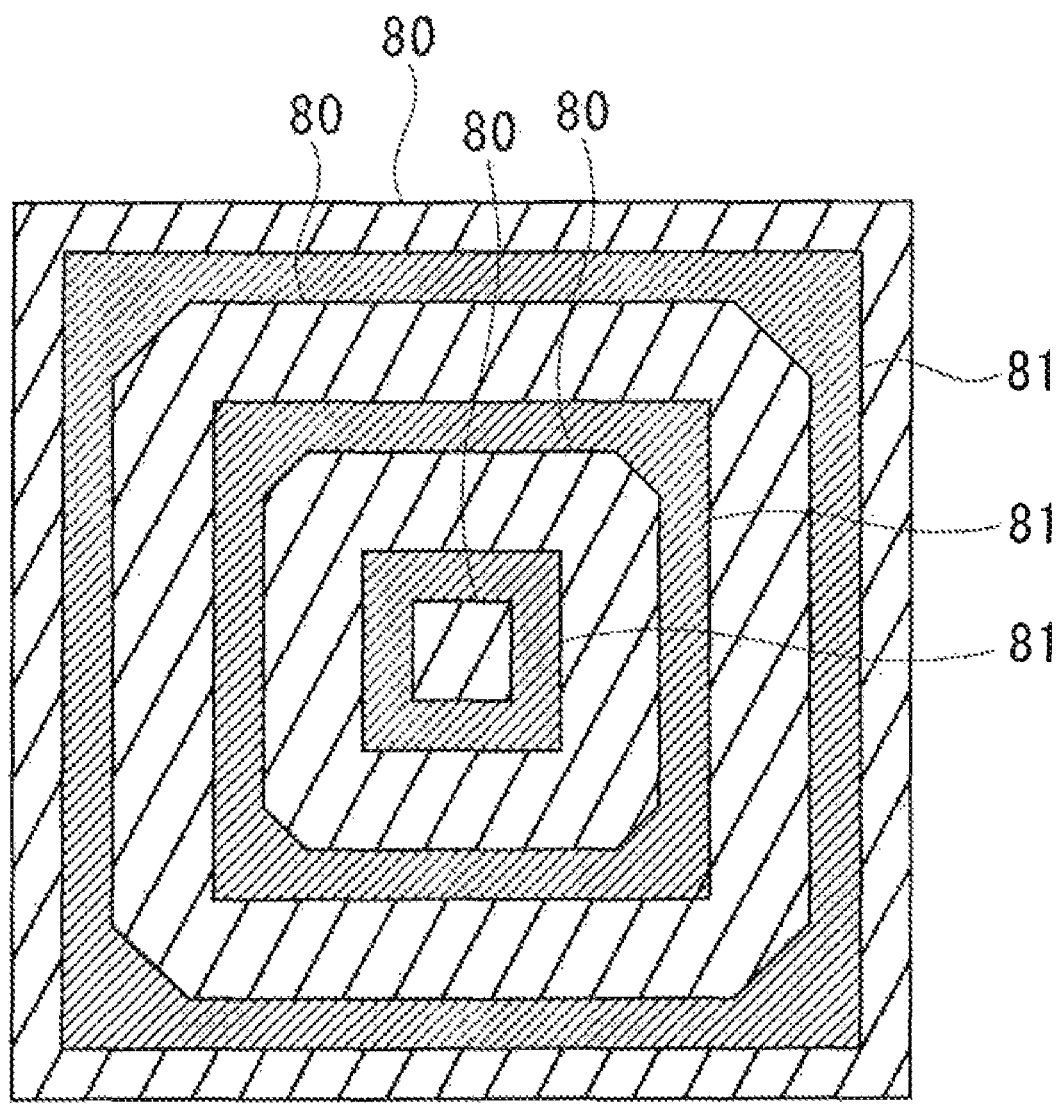
FIG. 45 is a top view illustrating CMP dummy patterns and assist patterns.

FIG. 45 is a top view illustrating the CMP dummy patterns 80 and assist patterns 81 which are used for the modified example of the semiconductor device manufacturing method. When a resist pattern for the CMP dummy patterns 80 is used, the assist patterns 81 illustrated in FIG. 45 may be formed in the same process as the process for forming the assist patterns 42 as described in the second embodiment.

As illustrated in FIG. 45, the CMP dummy patterns 80 are formed on side surfaces of the assist patterns 81. The CMP dummy patterns 80 illustrated in FIG. 45 may be formed in the same process as the process for forming the hard mask patterns 44 as described in the second embodiment. When the assist patterns 81 illustrated in FIG. 45 are removed, the CMP dummy patterns 80 may be formed above the semiconductor substrate 1.

Computer Readable Recording Medium

It is possible to record a program which causes a computer to implement any of the functions described above on a computer readable recording medium. By causing the computer to read in the program from the recording medium and execute it, the function thereof can be provided. The computer readable recording medium mentioned herein indicates a recording medium which stores information such as data and a program by an electric, magnetic, optical, mechanical, or chemical operation and allows the stored information to be read from the computer. Of such recording media, those detachable from the computer include, e.g., a flexible disk, a magneto-optical disk, a CD-ROM, a CD-R/W, a DVD, a DAT, an 8-mm tape, and a memory card. Of such recording media, those fixed to the computer include a hard disk and a ROM (Read Only Memory).

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present inventions have been described in detail, it should be understood that the various changes, substitutions, and alterations could be made hereto without departing from the spirit and scope of the invention.

What is claimed is:

1. A semiconductor device manufacturing method, comprising:
   forming a conductive film over a substrate;
   forming an assist pattern on the conductive film;
   forming a metal film to cover the conductive film and the assist pattern;
   etching back the metal film to form at least one side wall film which is the metal film on a side surface of the assist pattern;
   removing the assist pattern after the forming the side wall film;
   forming at least one resist pattern to selectively expose a portion of the conductive film and a portion of the side wall film, after the removing the assist pattern;
   performing etching using the resist pattern as a mask to remove the exposed portion of the side wall film; and
   etching the conductive film using the side wall film as a mask to form a gate electrode and a contact region electrically connected to the gate electrode,
   wherein a shape of the side wall film left on the conductive film by removing a portion exposed from the resist pattern corresponds to a shape of the gate electrode and a shape of the contact region, and
   wherein a shape of the assist pattern is in contact with at least three sides of the side wall film corresponding to the shape of the contact region.

2. The semiconductor device manufacturing method according to claim 1, wherein the forming the assist pattern on the conductive film comprises forming a plurality of the assist patterns on the conductive film so that a distance between adjacent two of the assist patterns is a distance equal to or smaller than two times of a width of the side wall film in a lateral direction, to thereby couple a side wall film formed on a side surface of one of the adjacent two assist patterns to a side wall film formed on a side surface of another of the adjacent two assist patterns.

3. A design support apparatus, comprising:
   a layout unit to create layout data of a semiconductor device, which contains shape data of gate electrodes and shape data of contact regions electrically connected to the gate electrodes;
   an extraction unit to extract, from the layout data, the shape data of the gate electrodes and the shape data of the contact regions;
   a first pattern creation unit to create shape data of an assist pattern which is sandwiched by at least two of the gate electrodes and at least two of the contact regions and is in contact with at least three sides of one of the at least two of the contact regions;
   a second pattern creation unit to provide a hard mask pattern around the assist pattern, to thereby create shape data of the hard mask pattern;
   a third pattern creation unit to remove shapes of the gate electrodes and shapes of the contact regions from a shape of the hard mask pattern, to thereby create partial shape data of the hard mask pattern; and
   a mask data creation unit to create shape data of a cutting mask in which a pattern including at least a partial shape of the hard mask pattern is formed.

4. A recording medium having a program recorded thereon, the program causing a design support apparatus to:
   create layout data of a semiconductor device, which contains shape data of gate electrodes and shape data of contact regions electrically connected to the gate electrodes;
   extract, from the layout data, the shape data of the gate electrodes and the shape data of the contact regions;
   create shape data of an assist pattern which is sandwiched by at least two of the gate electrodes and at least two of the contact regions and is in contact with at least three sides of one of the at least two of the contact regions;
   provide a hard mask pattern around the assist pattern, to thereby create shape data of the hard mask pattern;
   remove shapes of the gate electrodes and shapes of the contact regions from a shape of the hard mask pattern, to thereby create partial shape data of the hard mask pattern; and
   create shape data of a cutting mask in which a pattern including at least a partial shape of the hard mask pattern is formed.

* * * * *